United States Patent
Bhardwaj et al.

(10) Patent No.: US 12,066,537 B2
(45) Date of Patent: Aug. 20, 2024

(54) LIGHT DETECTION AND RANGING (LIDAR) SYSTEM INCLUDING HIGH-POWER AMPLIFIER

(71) Applicant: Aurora Operations, Inc., Mountain View, CA (US)

(72) Inventors: Ashish Bhardwaj, Mountain View, CA (US); Amir Hosseini, San Jose, CA (US)

(73) Assignee: Aurora Operations, Inc, Pittsburgh, PA (US)

( * ) Notice: Subject to any disclaimer, the term of this patent is extended or adjusted under 35 U.S.C. 154(b) by 0 days.

(21) Appl. No.: 18/149,008

(22) Filed: Dec. 30, 2022

(65) Prior Publication Data

US 2024/0219566 A1    Jul. 4, 2024

(51) Int. Cl.
*G01S 17/58* (2006.01)
*G01S 17/931* (2020.01)
*H01S 5/024* (2006.01)
*H01S 5/343* (2006.01)
*H01S 5/065* (2006.01)

(52) U.S. Cl.
CPC .......... *G01S 17/58* (2013.01); *H01S 5/02461* (2013.01); *H01S 5/343* (2013.01); *G01S 17/931* (2020.01); *H01S 5/0656* (2013.01)

(58) Field of Classification Search
CPC .... G01S 17/58; G01S 17/931; H01S 5/02461; H01S 5/343; H01S 5/0656
USPC ....................................................... 356/4.01
See application file for complete search history.

(56) References Cited

U.S. PATENT DOCUMENTS

| | | | | |
|---|---|---|---|---|
| 5,473,174 A * | 12/1995 | Ohsawa | ............ | H01L 21/02461 257/E29.081 |
| 5,585,957 A * | 12/1996 | Nakao | ............. | H01L 31/035236 257/14 |
| 7,397,995 B2 * | 7/2008 | Blauvelt | ............ | G02B 6/12002 385/129 |
| 8,837,869 B2 * | 9/2014 | Akutsu | ................ | G02B 6/1228 385/11 |
| 11,740,337 B1 * | 8/2023 | Barber | .................. | G01S 7/4817 356/4.01 |

(Continued)

FOREIGN PATENT DOCUMENTS

WO    WO-2014129613 A1 *    8/2014    ......... G02B 6/12014

OTHER PUBLICATIONS

Translation of description of Ota, WO2014129613A1, 159 pp. translated created Dec. 11, 2023. (Year: 2023).*

(Continued)

*Primary Examiner* — Daniel L Murphy
(74) *Attorney, Agent, or Firm* — PATENT LAW WORKS LLP

(57) ABSTRACT

A LIDAR system comprising a laser configured to output a beam, a modulator configured to receive the beam and modulate the beam to generate a modulated beam, a photonic integrated circuit having an amplifier coupled to receive the modulated beam from the modulator and generate an amplified beam, the amplifier having an active layer and an alternating or periodic or a super lattice structure configured to dissipate heat; and a transceiver chip coupled to the photonic integrated circuit, the transceiver chip configured to emit the amplified beam and receive a reflected beam from a target.

21 Claims, 12 Drawing Sheets

(56) References Cited

U.S. PATENT DOCUMENTS

| | | | |
|---|---|---|---|
| 2002/0159688 A1* | 10/2002 | Kim | G02B 6/12004 |
| | | | 385/24 |
| 2005/0063443 A1 | 3/2005 | Onishi | |
| 2013/0162976 A1 | 6/2013 | Dakin | |
| 2015/0078410 A1 | 3/2015 | Padullaparthi | |
| 2019/0317341 A1 | 10/2019 | Nishikawa | |
| 2021/0382142 A1* | 12/2021 | Rogers | G01S 7/4861 |
| 2022/0187536 A1* | 6/2022 | Sharma | H01L 23/66 |
| 2022/0221566 A1 | 7/2022 | Hong | |
| 2022/0236500 A1* | 7/2022 | Choi | G02B 6/4255 |
| 2022/0370010 A1* | 11/2022 | Zilkie | G02B 6/12007 |

OTHER PUBLICATIONS

International Search Report and Written Opinion issued for PCT/US2023/080152, mailed Mar. 26, 2024, 9 pgs.

\* cited by examiner

LIGHT DETECTION AND RANGING (LIDAR) SYSTEM INCLUDING HIGH-POWER AMPLIFIER

TECHNICAL FIELD

The present disclosure pertains to high-power amplifiers (e.g., optical amplifiers) for a light detection and ranging (LIDAR) system, and more specifically to a monolithically integrated high-power optical amplifier including passive and active components for a LIDAR system.

BACKGROUND

LIDAR sensor systems are used for a variety of applications, from altimetry, to imaging, to collision avoidance. The design and implementation of a LIDAR sensor system may use one or more photonic integrated circuits (PICs) or integrated optical circuits which is a chip that contains photonic components. There have been attempts in the past to include more photonic components and optical functionality of the LIDAR system onto a single PIC.

SUMMARY

Implementations of the present disclosure relate to a high-power optical amplifier(s) for a LIDAR system, and more particularly to a monolithically integrated high-power optical amplifier(s) including passive and active components for a LIDAR system.

According to one aspect of the subject matter described in this disclosure, a LIDAR system comprises a laser configured to output a beam, a modulator coupled to receive the beam output from the seed laser and modulate the beam to generate a modulated beam, a photonic integrated circuit having an optical amplifier(s) coupled to receive the modulated beam from the modulator and generate an amplified beam, the amplifier includes an active layer for amplification and a particular structure that is configured to dissipate heat, and a transceiver chip coupled to the photonic integrated circuit, the transceiver chip configured to emit the amplified beam and receive a reflected beam from a target.

According to another aspect of the subject matter described in this disclosure, a photonic integrated circuit comprises a first optical amplifier coupled to receive an input beam and generate an amplified beam, the first amplifier having an active layer for amplification and a particular structure that is configured to dissipate heat, and one or more passive components monolithically integrated with the first optical amplifier as part of the photonic integrated circuit.

These and other implementations may each optionally include one or more of the following features. For instance, the features may include that the active layer is an offset bulk or multi quantum well structure, for example, an offset bulk or multi quantum well structure is one from a group of offset quantum wells or offset dot layer. For example, features may also include that the photonic integrated circuit includes a first heat dissipation structure to reduce heat from the lower side of the photonics integrated circuit and a second heat dissipation structure to reduce heat from the upper side of the photonics integrated circuit. In another example, the features may include that the particular structure includes one or more alternating indium phosphide (InP) layers or the particular structure includes an alternating or periodic or super lattice structure that comprises one or more alternating Indium Phosphide and Indium Gallium Arsenide Phosphide (InGaAsP) or Indium Gallium Aluminium Arsenide (In-GaAlAs) or other quaternary or ternary alloys layers with improved thermal dissipation and high wall plug efficiency. In one example, the particular structure has an optical mode size and is integrated with a silicon photonics waveguide. In another feature, the photonic integrated circuit includes a monolithically integrated spot-size converter, wherein the photonic integrated circuit is optically coupled to an optical waveguide, e.g., an optical fiber connector. In some features, the photonic integrated circuit includes one or more passive components that are monolithically integrated with the optical amplifier, or the one or more passive components include a Semiconductor Optical Amplifier (SOA) coupled by a U-turn to a coupler that are monolithically integrated to provide an optical input and output on the same side of the photonic integrated circuit. For example, the particular SOA includes an alternating or a periodic or a super lattice structure with improved thermal dissipation and high wall plug efficiency. For instance, the features may include that the photonic integrated circuit comprises and integrates monolithically a second optical amplifier providing a particular gain, and an output of the second amplifier is coupled to an input of the first amplifier.

Those skilled in the art will appreciate that the summary is illustrative only and is not intended to be in any way limiting. Any of the features described herein may be used with any other features, and any subset of such features can be used in combination according to various implementations. Other aspects, inventive features, and advantages of the devices and/or processes described herein, as defined solely by the claims, will become apparent in the detailed description set forth herein and taken in conjunction with the accompanying drawings. Moreover, the language used in the present disclosure has been principally selected for readability and instructional purposes, and not to limit the scope of the subject matter disclosed herein.

BRIEF DESCRIPTION OF THE DRAWINGS

Implementations are illustrated by way of example, and not by way of limitation, in the figures of the accompanying drawings in which like reference numerals refer to similar elements and in which.

Figure 1A:
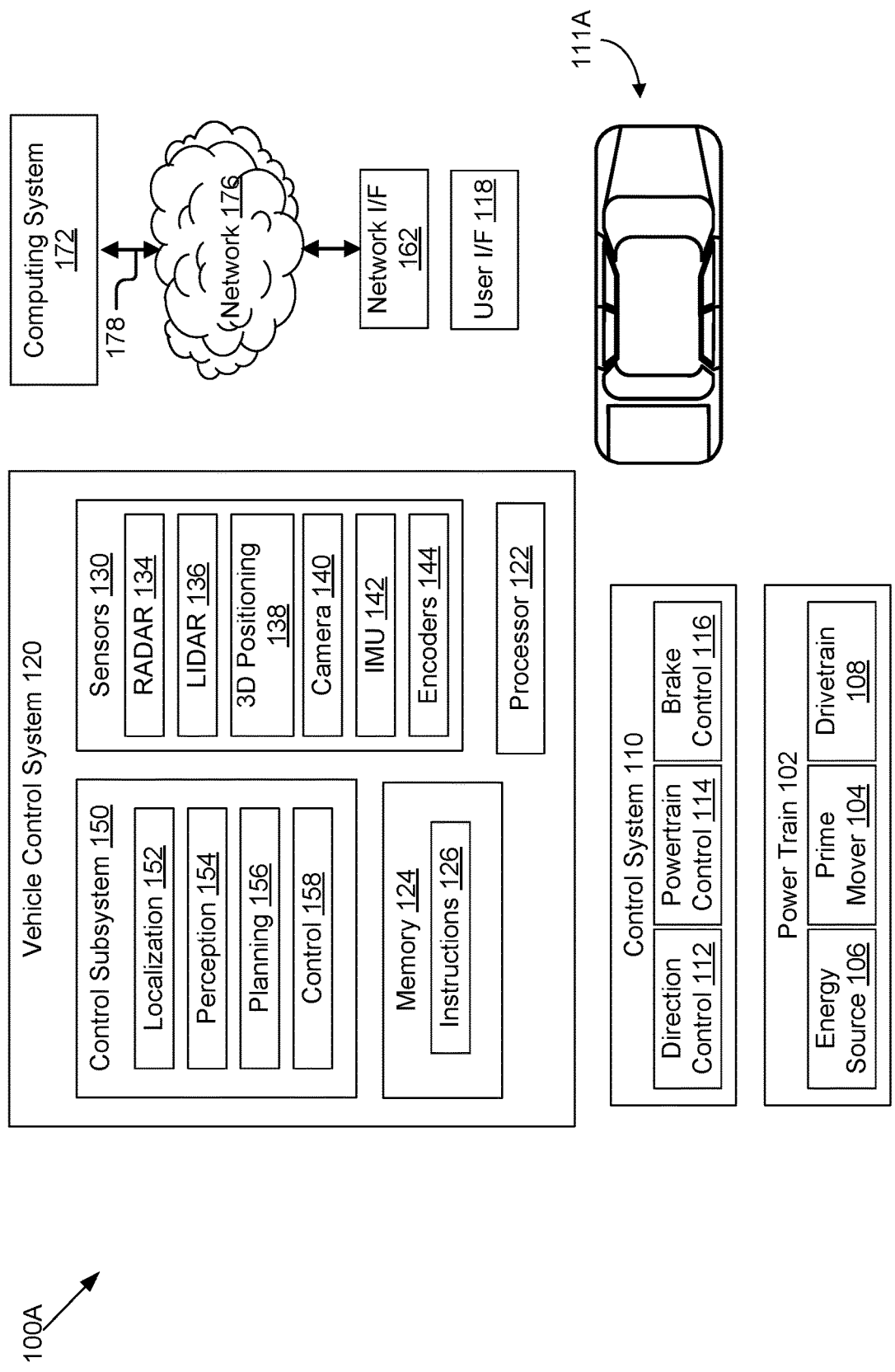
FIG. 1A is a block diagram illustrating an example of a system environment for an autonomous vehicle according to some implementations.

It should be understood that alternative implementations of the structures and methods illustrated herein may be employed without departing from the principles described herein.

DETAILED DESCRIPTION

According to certain aspects, a LIDAR system comprises a laser configured to output a beam, a modulator configured to receive the beam from the laser and modulate the beam to generate a modulated beam, a photonic integrated circuit having an amplifier coupled to receive the modulated beam from the modulator and generate an amplified beam, the optical amplifier includes an active layer and an alternating or periodic or a super lattice structure for improved thermal dissipation; and a transceiver chip coupled to the photonic integrated circuit, the transceiver chip configured to emit the amplified beam and receive a reflected beam from a target. The LIDAR system is advantageous because it includes a photonic integrated circuit that is configured for easy horizontal integration with the other components of the LIDAR system. In some implementations, the photonic integrated circuit comprises a first amplifier coupled to receive an input beam and generate an amplified beam, the first amplifier having an active layer for high power and an alternating, a periodic, or a super lattice structure for improved thermal dissipation, and one or more passive components monolithically integrated with the first amplifier as part of the photonic integrated circuit. The photonic integrated circuit may include multiple optical amplifiers and passive components including U-turns so that the photonic integrated circuit provides both high power and high gain and with high wall-plug efficiency arising from improved thermal dissipation. Because of this photonic integrated circuit, the LIDAR system overcomes the shortcomings of the prior art noted above because the photonic integrated circuit has both high optical power, high gain, and high wall-plug efficiency. Moreover, the photonic integrated circuit has the inputs and output along one side or facet of the chip for ease of optical coupling.

In the following description, for purposes of explanation, numerous specific details are set forth to provide a thorough understanding of the various aspects of different example implementations. Note that any particular example implementation may in various cases be practiced without all of the specific details and/or with variations, permutations, and combinations of the various features and elements described herein. Reference will now be made in detail to the implementations of the present disclosure, examples of which are illustrated in the accompanying drawings. Wherever possible, the same reference numbers are used in the drawings and the description to refer to the same or like parts.

Furthermore, relative terms, such as "lower" or "bottom" or "back" or "below" and "upper" or "top" or "front" or "above" may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The example term "lower" can, therefore, encompass both an orientation of "lower" and "upper," depending upon the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Referring to the drawings, wherein like numbers denote like parts throughout the several views, FIG. 1A illustrates an example of a system environment 100A for an autonomous vehicle 111A within which various techniques disclosed herein may be implemented. The vehicle 111A, for example, may include a powertrain 102 including a prime mover 104 powered by an energy source 106 and capable of providing power to a drivetrain 108, as well as a control system 110 including a direction control 112, a powertrain control 114, and a brake control 116. The vehicle 111A may be implemented as any number of different types of vehicles, including vehicles capable of transporting people and/or cargo, and capable of traveling by land and it should be appreciated that the aforementioned components 102-116 may vary widely based upon the type of vehicle within which these components are utilized.

For simplicity, the implementations discussed hereinafter focus on a wheeled land vehicle such as a car, van, truck, bus, etc. In such implementations, the prime mover 104 may include one or more electric motors and/or an internal combustion engine (among others). The energy source 106 may include, for example, a fuel system (e.g., providing gasoline, diesel, hydrogen, etc.), a battery system, solar panels, or other renewable energy sources, and/or a fuel cell system. The drivetrain 108 includes wheels and/or tires along with a transmission and/or any other mechanical drive components suitable for converting the output of the prime mover 104 into vehicular motion, as well as one or more brakes configured to controllably stop or slow the vehicle 111A and direction or steering components suitable for controlling the trajectory of the vehicle 111A (e.g., a rack and pinion steering linkage enabling one or more wheels of the vehicle 111A to pivot about a generally vertical axis to vary an angle of the rotational planes of the wheels relative to the longitudinal axis of the vehicle). In some implementations, combinations of powertrains and energy sources may be used (e.g., in the case of electric/gas hybrid vehicles), and in other implementations, multiple electric motors (e.g., dedicated to individual wheels or axles) may be used as a prime mover 104. In the case of a hydrogen fuel cell implementation, the prime mover 104 may include one or more electric motors and the energy source 106 may include a fuel cell system powered by hydrogen fuel.

The direction control 112 may include one or more actuators and/or sensors for controlling and receiving feedback from the direction or steering components to enable the vehicle 111A to follow a desired trajectory. The powertrain control 114 may be configured to control the output of the powertrain 102, e.g., to control the output power of the prime mover 104, to control a gear of a transmission in the drivetrain 108, etc., thereby controlling a speed and/or direction of the vehicle 111A. The brake control 116 may be configured to control one or more brakes that slow or stop vehicle 111A, e.g., disk or drum brakes coupled to the wheels of the vehicle.

Other vehicle types, including, but not limited to, all-terrain or tracked vehicles, and construction equipment, may utilize different powertrains, drivetrains, energy sources, direction controls, powertrain controls and brake controls. Moreover, in some implementations, some of the components can be combined, e.g., where directional control of a vehicle is primarily handled by varying an output of one or more prime movers. Therefore, implementations disclosed herein are not limited to the particular application of the herein-described techniques in an autonomous wheeled land vehicle.

In the illustrated implementation, various levels of autonomous control including full or semi-autonomous control over the vehicle 111A can be implemented in a vehicle control system 120, which may include one or more processors 122 and one or more memories 124, with each processor 122 configured to execute program code instructions 126 stored in a memory 124. The processors(s) can include, for example, graphics processing unit(s) ("GPU(s)") and/or central processing unit(s) ("CPU(s)").

Sensors 130 may include various sensors suitable for collecting information from a vehicle's surrounding environment for use in controlling the operation of the vehicle 111A. For example, sensors 130 can include one or more detection and ranging sensors (e.g., a RADAR sensor 134, a LIDAR sensor 136, or both), a 3D positioning sensor 138, e.g., a satellite navigation system such as GPS (Global Positioning System), GLONASS (Global Naya Navigazionnaya Sputnikovaya Sistema, or Global Navigation Satellite System), BeiDou Navigation Satellite System (BDS), Galileo, Compass, etc. The 3D positioning sensors 138 can be used to determine the location of the vehicle on the Earth using satellite signals. The sensors 130 can optionally include a camera 140 and/or an IMU (inertial measurement unit) 142. The camera 140 can be a monographic or stereographic camera and can record still and/or video images. The IMU 142 can include multiple gyroscopes and accelerometers capable of detecting linear and rotational motion of the vehicle 111A in three directions. One or more encoders 144, such as wheel encoders may be used to monitor the rotation of one or more wheels of vehicle 111A. In some implementations, the LIDAR sensor 136 may include a structure of the silicon photonics device for the coherent LIDAR system as described in detail below.

The outputs of sensors 130 may be provided to a set of control subsystems 150, including, a localization subsystem 152, a perception subsystem 154, a planning subsystem 156, and a control subsystem 158. The localization subsystem 152 is principally responsible for precisely determining the location and orientation (also sometimes referred to as "pose" or "pose estimation") of the vehicle 111A within its surrounding environment, and generally within some frame of reference. The perception subsystem 154 is principally responsible for detecting, tracking, and/or identifying objects within the environment surrounding vehicle 111A. A machine learning model in accordance with some implementations can be utilized in tracking objects. The planning subsystem 156 is principally responsible for planning a trajectory or a path of motion for vehicle 111A over some timeframe given a desired destination as well as the static and moving objects within the environment. A machine learning model in accordance with some implementations can be utilized in planning a vehicle trajectory. The control sub system 158 is principally responsible for generating suitable control signals for controlling the various controls in the vehicle control system 120 in order to implement the planned trajectory of the vehicle 111A. Similarly, a machine learning model can be utilized to generate one or more signals to control the autonomous vehicle 111A to implement the planned trajectory.

It will be appreciated that the collection of components illustrated in FIG. 1A for the vehicle control system 120 is merely one example. Individual sensors may be omitted in some implementations. Additionally, or alternatively, in some implementations, multiple sensors of the same types illustrated in FIG. 1A may be used for redundancy and/or to cover different regions around a vehicle. Moreover, there may be additional sensors of other types beyond those described above to provide actual sensor data related to the operation and environment of the wheeled land vehicle. Likewise, different types and/or combinations of control subsystems may be used in other implementations. Further, while subsystems 152-158 are illustrated as being separate from processor 122 and memory 124, it should be appreciated that in some implementations, some or all of the functionality of a subsystem 152-158 may be implemented with program code instructions 126 resident in one or more memories 124 and executed by one or more processors 122, and that these subsystems 152-158 may in some instances be implemented using the same processor(s) and/or memory. Subsystems may be implemented at least in part using various dedicated circuit logic, various processors, various field programmable gate arrays ("FPGA"), various application-specific integrated circuits ("ASIC"), various real time controllers, and the like, as noted above, multiple subsystems may utilize circuitry, processors, sensors, and/or other components. Further, the various components in the vehicle control system 120 may be networked in various manners.

In some implementations, the vehicle 111A may also include a secondary vehicle control system (not illustrated), which may be used as a redundant or backup control system for the vehicle 111A. In some implementations, the secondary vehicle control system may be capable of fully operating the autonomous vehicle 111A in the event of an adverse event in the vehicle control system 120, while in other implementations, the secondary vehicle control system may only have limited functionality, e.g., to perform a controlled stop of the vehicle 111A in response to an adverse event detected in the primary vehicle control system 120. In still other implementations, the secondary vehicle control system may be omitted.

In general, different architectures, including various combinations of software, hardware, circuit logic, sensors, networks, etc. may be used to implement the various components illustrated in FIG. 1A. Each processor may be implemented, for example, as a microprocessor and each memory may represent the random-access memory ("RAM") devices comprising a main storage, as well as any supplemental levels of memory, e.g., cache memories, non-volatile or backup memories (e.g., programmable or flash memories), read-only memories, etc. In addition, each memory may be considered to include memory storage physically located elsewhere in the vehicle 111A, e.g., any cache memory in a processor, as well as any storage capacity used as a virtual memory, e.g., as stored on a mass storage device or another computer controller. One or more processors 122 illustrated in FIG. 1A, or entirely separate processors, may be used to implement additional functionality in the vehicle 111A outside of the purposes of autonomous control, e.g., to control entertainment systems, to operate doors, lights, convenience features, etc.

In addition, for additional storage, the vehicle 111A may include one or more mass storage devices, e.g., a removable disk drive, a hard disk drive, a direct access storage device ("DASD"), an optical drive (e.g., a CD drive, a DVD drive, etc.), a solid-state storage drive ("SSD"), network attached storage, a storage area network, and/or a tape drive, among others.

Furthermore, the vehicle 100 may include a user interface 118 to enable vehicle 111A to receive a number of inputs from and generate outputs for a user or operator, e.g., one or more displays, touchscreens, voice and/or gesture interfaces, buttons, and other tactile controls, etc. Otherwise, user input may be received via another computer or electronic device, e.g., via an app on a mobile device or via a web interface.

Moreover, the vehicle 111A may include one or more network interfaces, e.g., network interface 162, suitable for communicating with one or more networks 176 to permit the communication of information with other computers and electronic devices, including, for example, a central service, such as a cloud service, from which the vehicle 111A receives information including trained machine learning models and other data for use in autonomous control thereof. The one or more networks 176, for example, may be a communication network and include a wide area network ("WAN") such as the Internet, one or more local area networks ("LANs") such as Wi-Fi LANs, mesh networks, etc., and one or more bus subsystems. The one or more networks 176 may optionally utilize one or more standard communication technologies, protocols, and/or inter-process communication techniques. In some implementations, data collected by the one or more sensors 130 can be uploaded to a computing system 172 via the network 176 for additional processing. In the illustrated implementation, the vehicle 111A may communicate via the network 176 and signal line 178 with a computing system 172. In some implementations, the computing system 172 is a cloud-based computing device. Additionally, processing of autonomous vehicle data by computing system 172 in accordance with many implementations is described with respect to FIG. 2.

Each processor illustrated in FIG. 1A, as well as various additional controllers and subsystems disclosed herein, generally operates under the control of an operating system and executes or otherwise relies upon various computer software applications, components, programs, objects, modules, data structures, etc., as described in greater detail below. Moreover, various applications, components, programs, objects, modules, etc. may also execute on one or more processors in another computer (e.g., computing system 172) coupled to vehicle 100 via network 176, e.g., in a distributed, cloud-based, or client-server computing environment, whereby the processing required to implement the functions of a computer program may be allocated to multiple computers and/or services over a network.

In general, the routines executed to implement the various implementations described herein, whether implemented as part of an operating system or a specific application, component, program, object, module, or sequence of instructions, or even a subset thereof, are referred to herein as "program code." Program code typically comprises one or more instructions that are resident at various times in various memory and storage devices, and that, when read and executed by one or more processors, perform the steps necessary to execute steps or elements embodying the various aspects of the present disclosure. Moreover, while implementations have and hereinafter are described in the context of fully functioning computers and systems, it should be appreciated that the various implementations described herein are capable of being distributed as a program product in a variety of forms, and that implementations can be implemented regardless of the particular type of computer readable media used to actually carry out the distribution.

Examples of computer readable media include tangible, non-transitory media such as volatile and non-volatile memory devices, floppy and other removable disks, solid state drives, hard disk drives, magnetic tape, and optical disks (e.g., CD-ROMs, DVDs, etc.) among others.

In addition, various program code described hereinafter may be identified based upon the application within which it is implemented in a specific implementation. However, it should be appreciated that any particular program nomenclature that follows is used merely for convenience, and thus the present disclosure should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the present disclosure is not limited to the specific organization and allocation of program functionality described herein.

The example environment illustrated in FIG. 1A is not intended to limit implementations disclosed herein. Indeed, other alternative hardware and/or software environments may be used without departing from the scope of implementations disclosed herein.

Figure 2:
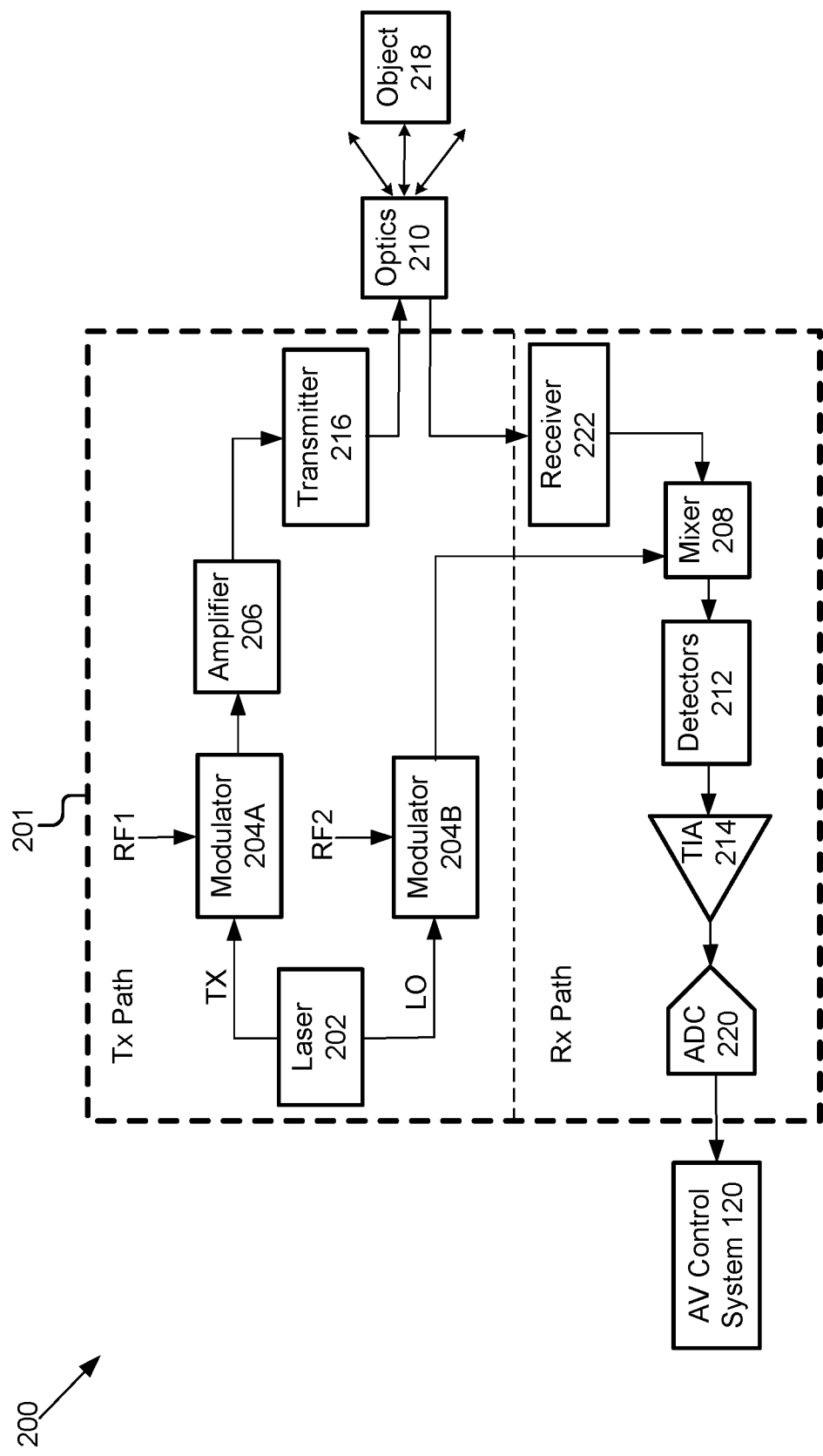
FIG. 2 is a block diagram illustrating an example of a LIDAR sensor system for autonomous vehicles, according to some implementations.

A truck can include a lidar system (e.g., vehicle control system 120 in FIG. 1A, lidar system 201 in FIG. 2, etc.). In some implementations, the lidar system can use frequency modulation to encode an optical signal and scatter the encoded optical signal into free space using optics. By detecting the frequency differences between the encoded optical signal and a returned signal reflected back from an object, the frequency modulated (FM) lidar system can determine the location of the object and/or precisely measure the velocity of the object using the Doppler effect. An FM lidar system may use a continuous wave (referred to as, "FMCW lidar" or "coherent FMCW lidar") or a quasi-continuous wave (referred to as, "FMQW lidar"). The lidar system can use phase modulation (PM) to encode an optical signal and scatters the encoded optical signal into free space using optics.

An FM or phase-modulated (PM) lidar system may provide substantial advantages over conventional lidar systems with respect to automotive and/or commercial trucking applications. To begin, in some instances, an object (e.g., a pedestrian wearing dark clothing) may have a low reflectivity, in that it only reflects back to the sensors (e.g., sensors 130 in FIG. 1A) of the FM or PM lidar system a low amount (e.g., 10% or less) of the light that hit the object. In other instances, an object (e.g., a shiny road sign) may have a high reflectivity (e.g., above 10%), in that it reflects back to the sensors of the FM lidar system a high amount of the light that hits the object.

Regardless of the object's reflectivity, an FM lidar system may be able to detect (e.g., classify, recognize, discover, etc.) the object at greater distances (e.g., 2×) than a conventional lidar system. For example, an FM lidar system may detect a low reflectivity object beyond 300 meters, and a high reflectivity object beyond 400 meters.

To achieve such improvements in detection capability, the FM lidar system may use sensors (e.g., sensors 130 in FIG. 1A). In some implementations, these sensors can be single photon sensitive, meaning that they can detect the smallest amount of light possible. While an FM lidar system may, in some applications, use infrared wavelengths (e.g., 950 nm, 1550 nm, etc.), it is not limited to the infrared wavelength range (e.g., near infrared: 800 nm-1500 nm; middle infrared: 1500 nm-5600 nm; and far infrared: 5600 nm-1,000,000 nm). By operating the FM or PM lidar system in infrared wavelengths, the FM or PM lidar system can broadcast stronger light pulses or light beams while meeting eye safety standards. Conventional lidar systems are often not sensitive to a single photon and/or only operate in near infrared wavelengths, requiring them to limit their light output (and distance detection capability) for eye safety reasons.

Thus, by detecting an object at greater distances, an FM lidar system may have more time to react to unexpected obstacles. Indeed, even a few milliseconds of extra time could improve safety and comfort, especially with heavy vehicles (e.g., commercial trucking vehicles) that are driving at highway speeds.

Another advantage of an FM lidar system is that it provides accurate velocity for each data point instantaneously. In some implementations, a velocity measurement is accomplished using the Doppler effect which shifts frequency of the light received from the object based at least one of the velocity in the radial direction (e.g., the direction vector between the object detected and the sensor) or the frequency of the laser signal. For example, for velocities encountered in on-road situations where the velocity is less than 100 meters per second (m/s), this shift at a wavelength of 1550 nanometers (nm) amounts to the frequency shift that is less than 130 megahertz (MHz). This frequency shift is small such that it is difficult to detect directly in the optical domain. However, by using coherent detection in FMCW, PMCW, or FMQW lidar systems, the signal can be converted to the RF domain such that the frequency shift can be calculated using various signal processing techniques. This enables the autonomous vehicle control system to process incoming data faster.

Instantaneous velocity calculation also makes it easier for the FM lidar system to determine distant or sparse data points as objects and/or track how those objects are moving over time. For example, an FM lidar sensor (e.g., sensors 130 in FIG. 1A) may only receive a few returns (e.g., hits) on an object that is 300 m away, but if those return give a velocity value of interest (e.g., moving towards the vehicle at >70 mph), then the FM lidar system and/or the autonomous vehicle control system may determine respective weights to probabilities associated with the objects.

Faster identification and/or tracking of the FM lidar system gives an autonomous vehicle control system more time to maneuver a vehicle. A better understanding of how fast objects are moving also allows the autonomous vehicle control system to plan a better reaction.

Another advantage of an FM lidar system is that it has less static compared to conventional lidar systems. That is, the conventional lidar systems that are designed to be more light-sensitive typically perform poorly in bright sunlight. These systems also tend to suffer from crosstalk (e.g., when sensors get confused by each other's light pulses or light beams) and from self-interference (e.g., when a sensor gets confused by its own previous light pulse or light beam). To overcome these disadvantages, vehicles using the conventional lidar systems often need extra hardware, complex software, and/or more computational power to manage this "noise."

In contrast, FM lidar systems do not suffer from these types of issues because each sensor is specially designed to respond only to its own light characteristics (e.g., light beams, light waves, light pulses). If the returning light does not match the timing, frequency, and/or wavelength of what was originally transmitted, then the FM sensor can filter (e.g., remove, ignore, etc.) out that data point. As such, FM lidar systems produce (e.g., generates, derives, etc.) more accurate data with less hardware or software requirements, enabling safer and smoother driving.

Lastly, an FM lidar system is easier to scale than conventional lidar systems. As more self-driving vehicles (e.g., cars, commercial trucks, etc.) show up on the road, those powered by an FM lidar system likely will not have to contend with interference issues from sensor crosstalk. Furthermore, an FM lidar system uses less optical peak power than conventional lidar sensors. As such, some, or all of the optical components for an FM lidar can be produced on a single chip, which produces its own benefits, as discussed herein.

Figure 1B:
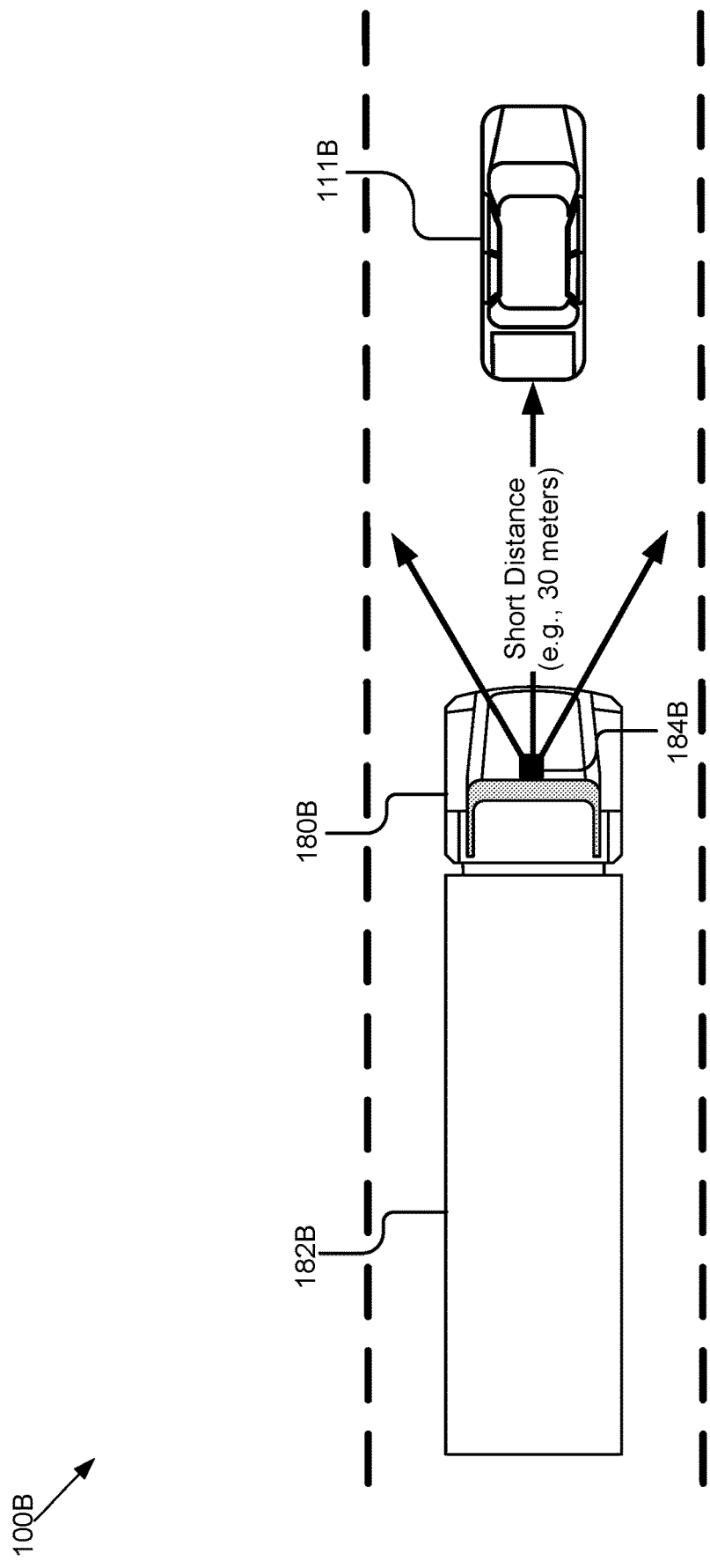
FIG. 1B is a schematic diagram illustrating an example of a system environment for autonomous commercial trucking vehicles, according to some implementations.

FIG. 1B is a schematic diagram illustrating an example of a system environment for autonomous commercial trucking vehicles, according to some implementations. The environment 100B includes a commercial truck 180B for hauling cargo 182B. In some implementations, the commercial truck 180B may include vehicles configured to long-haul freight transport, regional freight transport, intermodal freight transport (i.e., in which a road-based vehicle is used as one of multiple modes of transportation to move freight), and/or any other road-based freight transport applications. The commercial truck 180B may be a flatbed truck, a refrigerated truck (e.g., a reefer truck), a vented van (e.g., dry van), a moving truck, etc. The cargo 182B may be goods and/or produce. The commercial truck 180B may include a trailer to carry the cargo 182B, such as a flatbed trailer, a lowboy trailer, a step deck trailer, an extendable flatbed trailer, a side kit trailer, etc.

The environment 100B includes an object 111B (shown in FIG. 1B as another vehicle) that is within a distance range that is equal to or less than 30 meters from the truck.

The commercial truck 180B may include a lidar system 184B (e.g., an FM lidar system, vehicle control system 120 in FIG. 1A, lidar system 201 in FIG. 2, etc.) for determining a distance to the object 111B and/or measuring the velocity of the object 111B. Although FIG. 1B shows that one lidar system 184B is mounted on the front of the commercial truck 180B, the number of lidar system and the mounting area of the lidar system on the commercial truck are not limited to a particular number or a particular area. The commercial truck 180B may include any number of lidar systems 184B (or components thereof, such as sensors, modulators, coherent signal generators, etc.) that are mounted onto any area (e.g., front, back, side, top, bottom, underneath, and/or bottom) of the commercial truck 180B to facilitate the detection of an object in any free-space relative to the commercial truck 180B.

As shown, the lidar system 184B in environment 100B may be configured to detect an object (e.g., another vehicle, a bicycle, a tree, street signs, potholes, etc.) at short distances (e.g., 30 meters or less) from the commercial truck 180B.

Figure 1C:
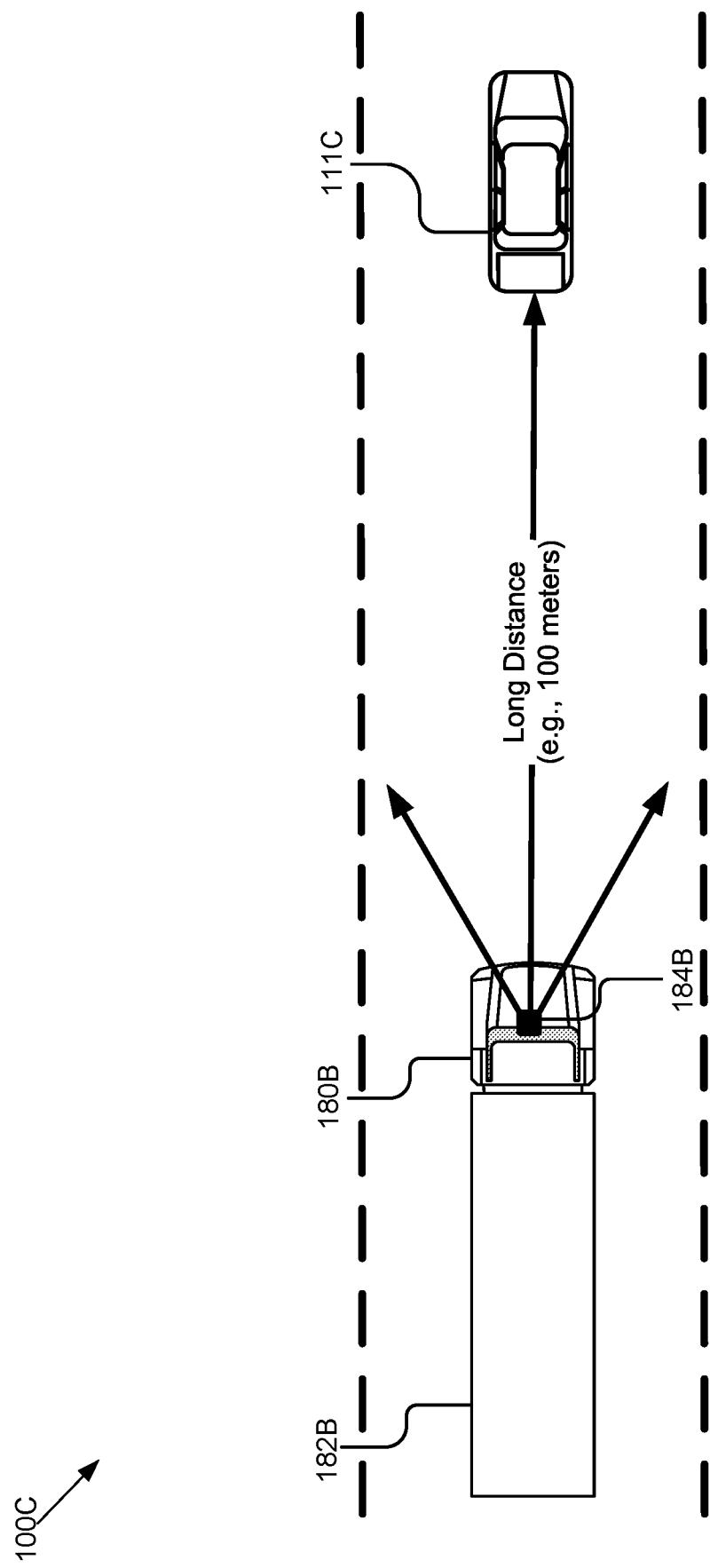
FIG. 1C is a schematic diagram illustrating an example of a system environment for autonomous commercial trucking vehicles, according to some implementations.

FIG. 1C is a schematic diagram illustrating an example of a system environment for autonomous commercial trucking vehicles, according to some implementations. The environment 100C includes the same components (e.g., commercial truck 180B, cargo 182B, lidar system 184B, etc.) that are included in environment 100B.

The environment 100C includes an object 111C (shown in FIG. 1C as another vehicle) that is within a distance range that is (i) more than 30 meters and (ii) equal to or less than 150 meters from the commercial truck 180B. As shown, the lidar system 184B in environment 100C may be configured to detect an object (e.g., another vehicle, a bicycle, a tree, street signs, potholes, etc.) at a distance (e.g., 100 meters) from the commercial truck 180B.

Figure 1D:
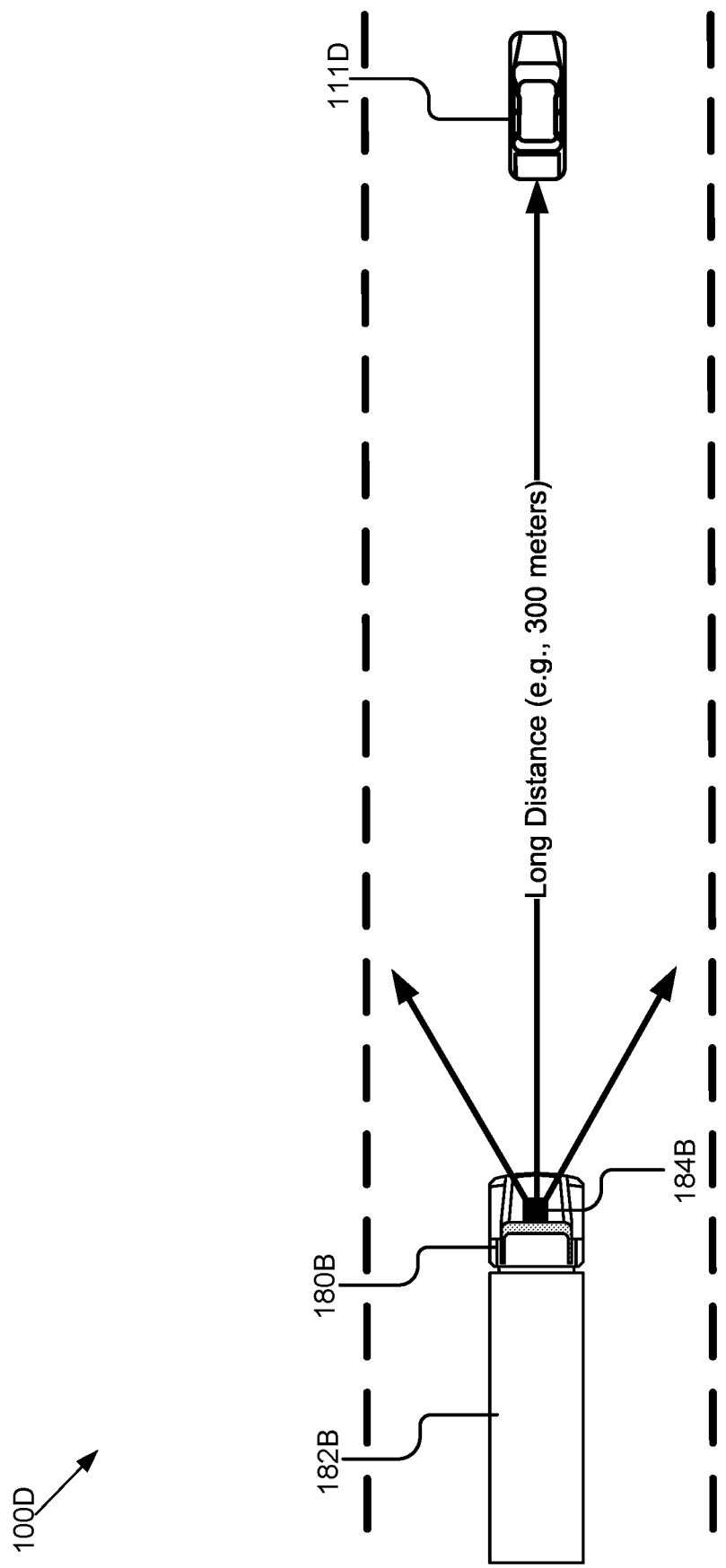
FIG. 1D is a schematic diagram illustrating an example of a system environment for autonomous commercial trucking vehicles, according to some implementations.

FIG. 1D is a schematic diagram illustrating an example of a system environment for autonomous commercial trucking vehicles, according to some implementations. The environment 100D includes the same components (e.g., commercial truck 180B, cargo 182B, lidar system 184B, etc.) that are included in environment 100B.

The environment 100D includes an object 111D (shown in FIG. 1D as another vehicle) that is within a distance range that is more than 150 meters from the commercial truck 180B. As shown, the lidar system 184B in environment 100D may be configured to detect an object (e.g., another vehicle, a bicycle, a tree, street signs, potholes, etc.) at a distance (e.g., 300 meters) from the commercial truck 180B.

In commercial trucking applications, it is important to effectively detect objects at all ranges due to the increased weight and, accordingly, longer stopping distance required for such vehicles. FM lidar systems (e.g., FMCW and/or FMQW systems) or PM lidar systems are well-suited for commercial trucking applications due to the advantages described above. As a result, commercial trucks equipped with such systems may have an enhanced ability to safely move both people and goods across short or long distances, improving the safety of not only the commercial truck but of the surrounding vehicles as well. In various implementations, such FM or PM lidar systems can be used in semi-autonomous applications, in which the commercial truck has a driver and some functions of the commercial truck are autonomously operated using the FM or PM lidar system, or fully autonomous applications, in which the commercial truck is operated entirely by the FM or lidar system, alone or in combination with other vehicle systems.

In a lidar system that uses CW modulation, the modulator modulates the laser light continuously. For example, if a modulation cycle is 10 seconds, an input signal is modulated throughout the whole 10 seconds. Instead, in a lidar system that uses quasi-CW modulation, the modulator modulates the laser light to have both an active portion and an inactive portion. For example, for a 10 second cycle, the modulator modulates the laser light only for 8 seconds (sometimes referred to as, "the active portion"), but does not modulate the laser light for 2 seconds (sometimes referred to as, "the inactive portion"). By doing this, the lidar system may be able to reduce power consumption for the 2 seconds because the modulator does not have to provide a continuous signal.

In Frequency Modulated Continuous Wave (FMCW) lidar for automotive applications, it may be beneficial to operate the lidar system using quasi-CW modulation where FMCW measurement and signal processing methodologies are used, but the light signal is not in the on-state (e.g., enabled, powered, transmitting, etc.) all the time. In some implementations, Quasi-CW modulation can have a duty cycle that is equal to or greater than 1% and up to 50%. If the energy in the off-state (e.g., disabled, powered-down, etc.) can be expended during the actual measurement time then there may be a boost to signal-to-noise ratio (SNR) and/or a reduction in signal processing requirements to coherently integrate all the energy in the longer time scale.

FIG. 2 is a block diagram illustrating an example environment of a lidar sensor system for autonomous vehicles, according to some implementations. The environment 200 includes a lidar sensor system 201 that includes a transmit (Tx) path and a receive (Rx) path. The Tx path includes one or more Tx input/output ports (not shown in FIG. 2), and the Rx path includes one or more Rx input/output ports (not shown in FIG. 2).

In some implementations, a semiconductor substrate and/or semiconductor package may include the Tx path and the Rx. In some implementations, the semiconductor substrate and/or semiconductor package may include at least one of silicon photonics circuitry, programmable logic controller (PLC), or III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

The environment 200 includes one or more transmitters 216 and one or more receivers 222.

The environment 200 includes one or more optics 210 (e.g., an oscillatory scanner, a unidirectional scanner, a Risley prism, a circulator optic, and/or a beam collimator, etc.) that are coupled to the lidar system 201. In some implementations, the one or more optics 210 may be coupled to the Tx path via the one or more Tx input/output ports. In some implementations, the one or more optics 210 may be coupled to the Rx path via the one or more Rx input/output ports.

The environment 200 includes a vehicle control system 120 (e.g., vehicle control system 120 in FIG. 1A) that is coupled to the lidar system 201. In some implementations, the vehicle control system 120 may be coupled to the Rx path via the one or more Rx input/output ports.

The Tx path may include a laser source 202, a modulator 204A, a modulator 204B, an amplifier 206, and one or more transmitters 216. The Rx path may include one or more receivers 222, a mixer 208, a detector 212, a transimpedance amplifier (TIA) 214, and one or more analog-to-digital converters (ADCs). Although FIG. 2 shows only a select number of components and only one input/output channel; the environment 200 may include any number of components and/or input/output channels (in any combination) that are interconnected in any arrangement to facilitate combining multiple functions of a lidar system, to support the operation of a vehicle.

The laser source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The laser source 202 may be configured to provide the light signal to the modulator 204A, which is configured to modulate a phase and/or a frequency of the light signal based on a first radio frequency (RF) signal (shown in FIG. 2 as, "RF1") and using Continuous Wave (CW) modulation or quasi-CW modulation to generate a modulated light signal. The modulator 204A may be configured to send the modulated light signal to the amplifier 206. The amplifier 206 may be configured to amplify the modulated light signal to generate an amplified light signal to the optics 210 via the one or more transmitters 216. The one or more transmitters 216 may include one or more optical waveguides or antennas.

The optics 210 may be configured to steer the amplified light signal that it receives from the Tx path into an environment within a given field of view toward an object 218, may receive a returned signal reflected back from the object 218, and provide the returned signal to the mixer 208 of the Rx path via the one or more receivers 222. The one or more receivers 222 may include one or more optical waveguides or antennas. In some arrangements, the transmitters 216 and the receivers 222 may constitute one or more transceivers (not shown in FIG. 2). In some arrangements, the one or more transceivers may include a monostatic transceiver or a bistatic transceiver.

The laser source 202 may be configured to provide the LO signal to the modulator 204B, which is configured to modulate a phase and/or a frequency of the LO signal based on a second RF signal (shown in FIG. 2 as, "RF2") and using Continuous Wave (CW) modulation or quasi-CW modulation to generate a modulated LO signal and send the modulated LO signal to the mixer 208 of the Rx path.

The mixer 208 may be configured to mix (e.g., combine, multiply, etc.) the modulated LO signal with the returned signal to generate a down-converted signal and send the down-converted signal to the detector 212. In some arrangements, the mixer 208 may be configured to send the modulated LO signal to the detector 212.

The detector 212 may be configured to generate an electrical signal based on the down-converted signal and send the electrical signal to the TIA 214. In some arrangements, the detector 212 may be configured to generate an electrical signal based on the down-converted signal and the modulated signal.

The TIA 214 may be configured to amplify the electrical signal and send the amplified electrical signal to the vehicle control system 120 via the one or more ADCs 220.

In some implementations, the TIA 214 may have a peak noise-equivalent power (NEP) that is less than 5 picowatts per square root Hertz (i.e., 5×10−12 Watts per square root Hertz). In some implementations, the TIA 214 may have a gain between 4 kiloohms and 25 kiloohms.

In some implementations, detector 212 and/or TIA 214 may have a 3-decibel bandwidth between 80 kilohertz (kHz) and 450 megahertz (MHz).

The vehicle control system 120 may be configured to determine a distance to the object 218 and/or measure the velocity of the object 218 based on the one or more electrical signals that it receives from the TIA via the one or more ADCs 220.

In some implementations, modulator 204A and/or modulator 204B may have a bandwidth between 400 megahertz (MHz) and 1000 (MHz).

In some implementations, the modulator 204A may be configured to send a first modulated light (optical) signal and a second modulated light (optical) signal to the amplifier 206. The amplifier 206 may be configured to amplify the first and second modulated light signals to generate amplified light signals to the optics 210 via the transmitters 216. The optics 210 may be configured to steer the first and second modulated light signals that it receives from the Tx path into an environment within a given field of view toward an object 218, may receive corresponding first and second returned signals reflected back from the object 218, and provide the first and second returned signals to the mixer 208 of the Rx path via the receivers 222. The modulator 204B may be configured to generate (1) a first modulated LO signal associated with the first modulated light signal and (2) a second modulated LO signal associated with the second modulated light signal and send the first and second modulated LO signals to the mixer 208 of the Rx path. The mixer 208 may be configured to pair (e.g., associate, link, identify, etc.) the first returned light signal and the first modulated LO signal, and mix (e.g., combine, multiply, etc.) the first returned light signal and the first modulated LO signal to generate a first down-converted signal and send the first down-converted signal to the detector 212. Similarly, the mixer 208 may be configured to pair the second returned light signal and the second modulated LO signal and mix the second returned light signal and the second modulated LO signal to generate a second down-converted signal and send the second down-converted signal to the detector 212. The detector 212 may be configured to generate first and second electrical signals based on the first and second down-converted signal, respectively. The vehicle control system 120 may be configured to determine a distance to the object 218 and/or measures the velocity of the object 218 based on the first and second electrical signals, received via TIA 214 and ADCs 220.

According to some implementations, the LIDAR system comprises a seed laser, a modulator, an amplifier, and a transceiver chip. The modular LIDAR system allows the components to be discrete optical components and integrated circuits, PICS, optically coupled by micro-lenses. This provides higher yield of the components, ease of configurability, assembly for different variations of each component, and variations in the PIC architecture, e.g., different ways in which the optical components can be arranged in the optical circuit to realize an optical functionality.

The seed laser is provided to generate a light beam. In some implementations, the seed laser may be a light source, examples of which include but are not limited to, a distributed feedback (DFB) or distributed Bragg Reflector (DBR) laser diode or an external cavity laser source. The light or beam from the seed laser may be optically coupled for input to the modulator. In one example, the seed laser includes a DFB diode laser source and a micro-lens assembly that couples the DFB diode laser source to the modulator. The seed laser can be modular in that it can be constructed as a single integrated circuit.

The modulator receives the light beam generated by the seed laser and generates a modulated light signal. In some implementations, the modulator includes a modulator and a splitter. In some implementations, the modulator performs in-phase and quadrature modulation to generate the modulated beam. In some implementations, the modulator performs phase modulation to generate the modulated beam. The splitter is coupled to the output of the modulator and provides the output of the modulator. In some implementations, the splitter is a single splitter that is a passive component that is hybridly integrated with the modulator of modulator. In some implementations, the splitter is a plurality of splitters. The modulator is modular in that it can be constructed as a single integrated circuit.

In some implementations, the seed laser and the modulator may be integrated to form a seed laser assembly. In some implementations, the seed laser assembly is mounted on a first sub-mount and the transceiver chip coupled is mounted on a second sub-mount for aligning the height of the seed laser assembly and the height of the transceiver chip 302 to optimize the optical coupling between the seed laser assembly and the transceiver chip.

The optical amplifier is one or more semiconductor optical amplifiers (SOA). In some implementations, the optical amplifier is one or more tapered semiconductor optical amplifiers (TSOA). In some implementations, the optical amplifier is one or more SOA array chips. Each SOA array chip includes integrated U-turns and other passive components for optical amplification. In some implementations, the SOA array chip may be a III-V semiconductor-based integrated photonic device in which all of its components are made of III-V materials and fabricated/monolithically integrated on a single substrate made of III-V materials. Moreover, in some implementations, each SOA array chip may include one or more channels, for example specifically 4 or 5, and is configured to amplify the beam through stimulated emission. The amplifier can be optically coupled to the modulator by micro-lenses. Similarly, the amplifier is optically coupled to provide the amplified signal to the transceiver chip by micro-lenses.

In some implementations, the silicon photonics (SiPho) transceiver chip includes at least one of silicon photonics circuitry, programmable logic controller (PLC), or III-V semiconductor circuitry. The SiPho transceiver chip processes the coupled light using the amplifier. The SiPho transceiver chip includes a plurality of coherent pixels that process the output of the optical amplifier and emits the light out from the surface of the SiPho transceiver chip, which includes via an optical window of the integrated chip packaging. The SiPho transceiver chip processes the light collected off a reflection from a target and couples the detected photocurrent to the transimpedance amplifier. The transimpedance amplifier converts the photocurrent into an electrical voltage which is then coupled out of the integrated chip packaging.

Figure 3:
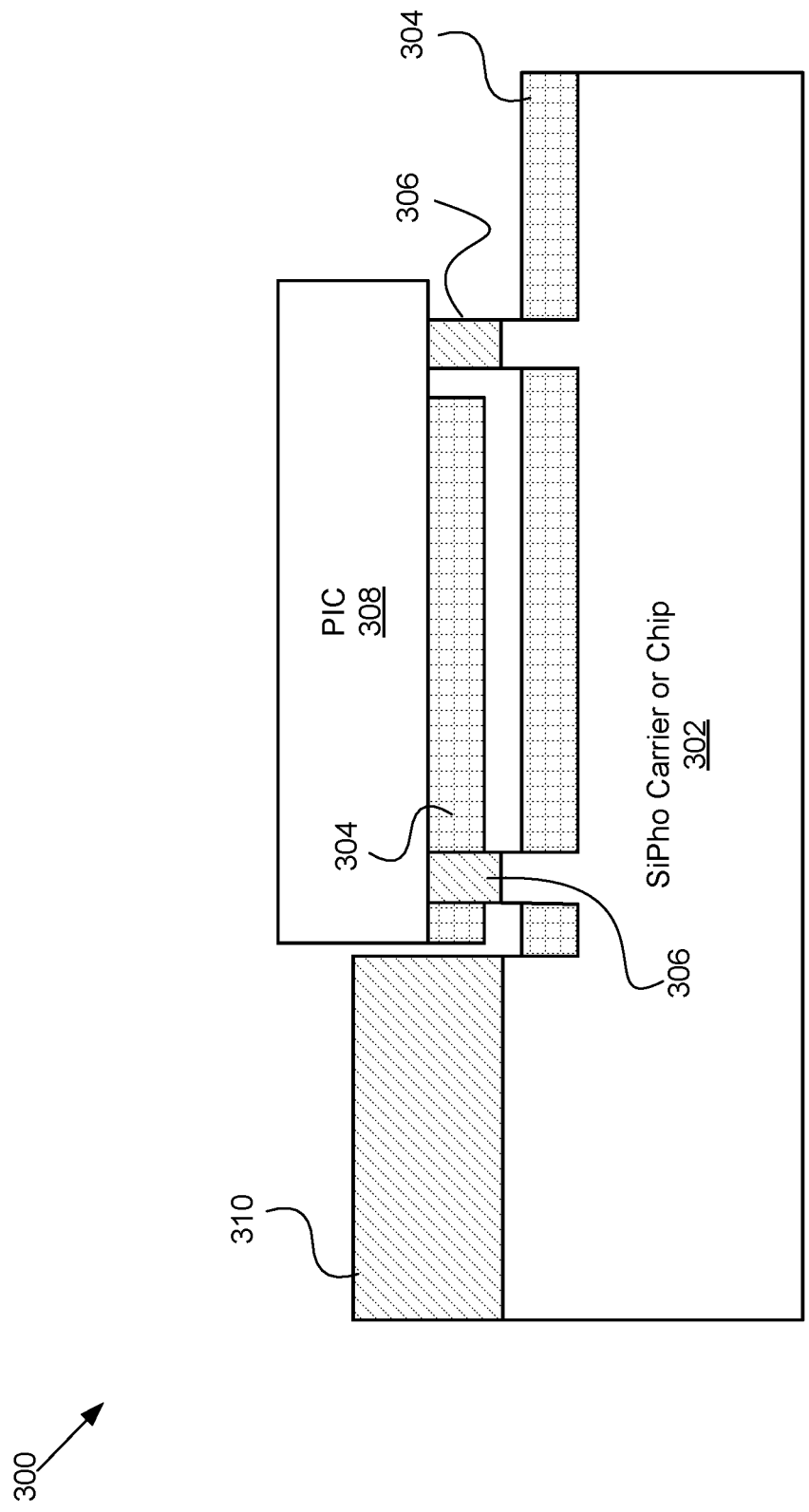
FIG. 3 is a cross-sectional view of a high-level block diagram illustrating an example of horizontal integration of a semiconductor optical amplifier for a LIDAR system for autonomous vehicles, according to some implementations.

Referring now to FIG. 3, an example of horizontal integration 300 of a photonic integrated circuit (PIC) 308 for a LIDAR system for autonomous vehicles, according to some implementations. FIG. 3 shows a cross-section of the PIC 308 mounted to the SiPho carrier or chip 302. The example of horizontal integration 300 couples the SiPho carrier or chip 302 with the PIC 308. As illustrated in FIG. 3, the SiPho carrier 302 defines one or more pedestals upon which to couple to the PIC 308. The PIC 308 is coupled to these pedestals of the SiPho carrier 302 by connectors 306. The structural alignment of the PIC 308 to the SiPho carrier 302 provides for robust alignment because of optical modes of the PIC 308. For example, the optical modes may have a size that can typically range from ~1.0 um to −3.0-10.0 um. On the same side as the pedestals (in FIG. 3 the top side), the SiPho carrier 302 has a metal layer 304 that provides for heat dissipation and backside metal patterning to assist with pick-and-place. A portion of the SiPho carrier 302 is also coupled by layer 310. Similarly, the PIC 308 has one side covered with a metal layer 304 for heat dissipation and backside metal patterning to assist with pick-and-place. In some implementations, the PIC 308 may include a second metal layer (not shown) on the side opposite of metal 306 for increased heat dissipation.

Figure 4A:
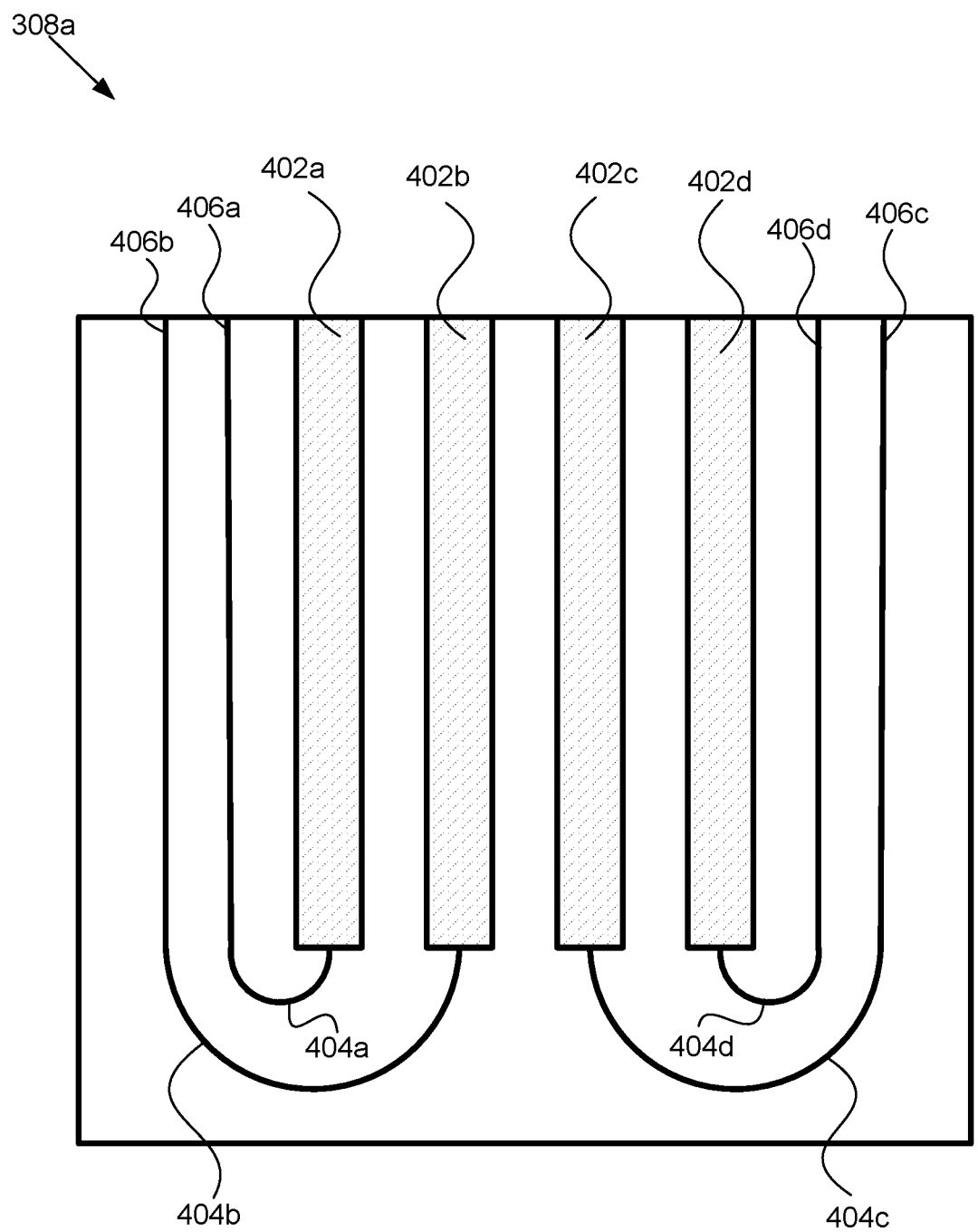
FIGS. 4A-4C are high-level planar views of example implementations for a semiconductor optical amplifier with U-turns and other passive components integrated to provide an optical input and output on the same side of the photonic integrated circuit for a LIDAR system for autonomous vehicles.
Figure 4B:
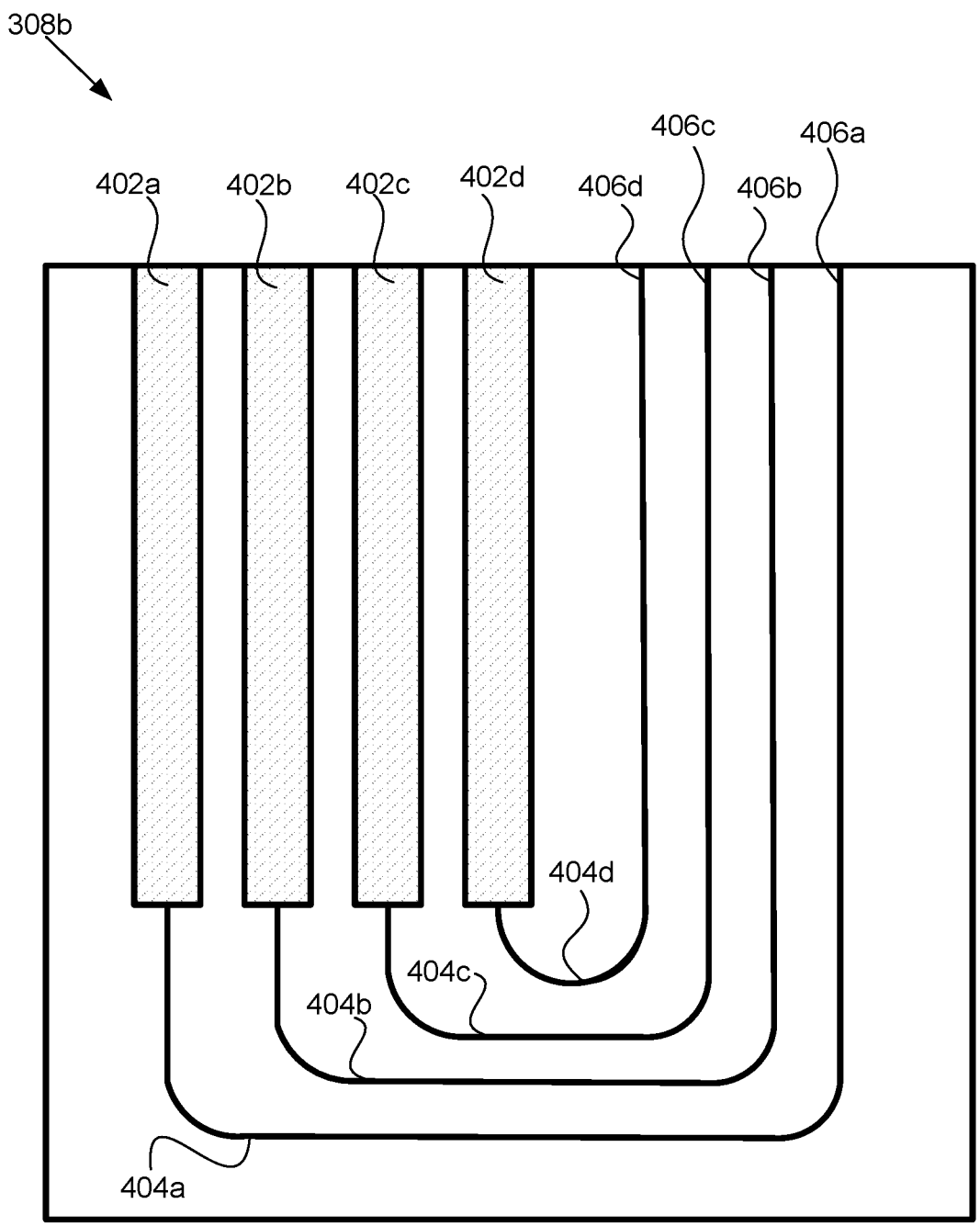
Figure 4C:
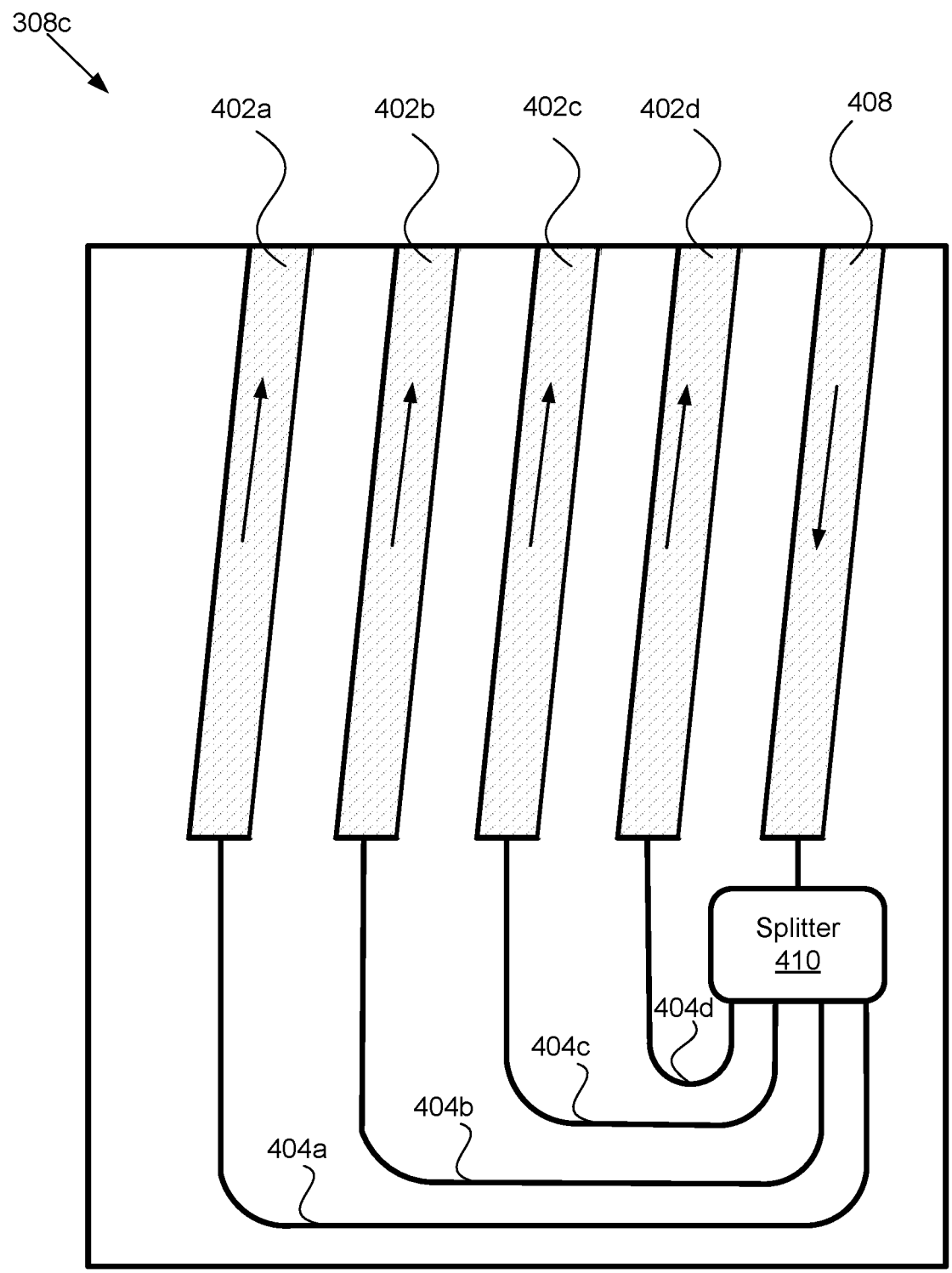

Referring now to FIGS. 4A-4C, various implementations of the example PICs 308a, 308b, and 308c will be described. The PIC 308 is advantageous because it includes both passive and active optical components that are monolithically integrated. FIGS. 4A-4C show high-level planar views of example implementations for a semiconductor optical amplifier for a LIDAR system for autonomous vehicles. In some implementations, the PIC 308 includes a monolithically integrated spot-sized converter optically coupling the photonic integrated circuit to the connectors with low-loss hybrid integration. In some implementations, the PIC 308 includes one or more passive components that are monolithically integrated with an optical amplifier as part of the PIC 308. For example, the one or more passive components are one or more from a group of U-turns, total internal reflectors, mirrors, couplers, and splitters. As will be described in more detail below with reference to FIGS. 4A-4C, the PIC 308 monolithically integrates an array of two or more optical amplifiers, a U-turn, and a passive component so that the photonic integrated circuit can be optically coupled from a single side. These and other features will be apparent from the description below of FIGS. 4A-4C. Moreover, particular features of the different implementations of the example PICs 308a, 308b, and 308c may be combined in other ways in addition to those specifically set forth in FIGS. 4A-4C.

FIG. 4A shows an implementation of a first example PIC 308a. In this implementation, the PIC 308a comprises the plurality of power SOAs 402a-402d, a plurality of U-turns 404a-404d, and a plurality of passive connectors 406a-406d. While FIG. 4A shows four SOAs 402a-402d, four U-turns 404a-404d, and four passive connectors 406a-406d, it should be understood that any number of SOAs, U-turns, and connectors may be monolithically integrated into the PIC 308a, and four amplifiers is merely used by way of example. FIG. 4A also illustrates how the plurality of SOAs 402a-402d and the plurality of passive connectors 406a-406d receive and send, respectively, optical signals from the single side of the PIC 308a. This is particularly advantageous for horizontal integration of the PIC 308 with other components because it allows easy optical alignment of the four SOAs 402a-402d. FIG. 4A also illustrates that the SOAs 402a-402d have straight facets. It should be understood that anti-reflective coating can be used to achieve −20 dB or less back reflection into the straight waveguide. It should be understood that the symmetrical waveguide layout shown in FIG. 4A for the SOAs 402a-402d provides uniformity of power in the amplifier array because of uniform heat/temperature distribution and uniform coupling efficiency in the case of bowing. In one example, the PIC 308a and its components may have values approximating the values in Table 1.

TABLE 1

| Specification | Value | Description |
| --- | --- | --- |
| SOA output power | >550 mW | >+27 dBm output optical power/SOA |
| Gain | >10 to 14 dB for each SOA | 14 dB gain at 20 mW (+13 dBm) input optical power |
| Wall plug efficiency (WPE) | 20-25% | Up to 2.5 W heat dissipation from each SOA at an electrical power ~15 W |
| Operating temperature | 0-50 degrees C. | MQW gain optimized over full temperature range Can use the vehicle cooling system |
| Pitch | 500 um | Compatible with P1 500 um to reduce thermal crosstalk |
| U turn excess loss | <1 dB | Waveguide loss, bend loss |
| Mode size | ~6-20 um (horizontal) ~5 um (vertical) | Large vertical mode-size beneficial for hybrid integration and higher Psat Allows coupling to multiple SiPho SSCs |
| Wafer thickness | ~200 um | Thick die has less bow, less prone to breakage |

The PIC 308a of FIG. 4A also shows an arrangement of the SOAs 402a-402d, U-turns 404a-404d, and passive connectors 406a-406d with the SOAs 402a-402d proximate the middle of the PIC 308 with 2 U-turns 404a and 404b coupled to connectors 406a and 406b on one side of the array of SOAs 402a-402d; while the other 2 U-turns 404c and 404d coupled to connectors 406c and 406d on the other side of the array of SOAs 402a-402d. In some implementations, the input optical power to each SOA 402a-402d is approximately 50 mW, the output power of each SOA 402a-402d is approximately 550 mW.

FIG. 4B shows an implementation of a second example PIC 308b. Again, this second example PIC 308b comprises the plurality of SOAs 402a-402d, the plurality of U-turns 404a-404d, and the plurality of passive connectors 406a-406d. The number of SOAs 402a-402d is four with corresponding number of U-turns 404a-404d, and passive connectors 406a-406d. However, alternate implementations of the PIC 308b may have any number of SOAs 402, U-turns 404 and passive connectors 406. The example PIC 308b and its components may also have the values approximating those described above in Table 1. FIG. 4B shows the differences in layout from the layout of FIG. 4A. More specifically, the SOAs 402a-402d are positioned on one side of the PIC 308b while the passive connectors 406a-406d run parallel to and on the side of the SOAs 402a-402d. A U-turn 404 couples a respective SOA 402 and a passive connector 406. U-turn 404a is longer than the other U-turns 404b-404d with each U-turn 404b-404d decreasing slightly in length from the other. FIG. 4B illustrates another configuration for integration, e.g., monolithic integration, where the inputs and output are both provided on one side (e.g., the top in FIG. 4B) of the PIC 308a with the inputs grouped toward a first end (e.g., the left side of FIG. 4B) of the PIC 308b while the outputs 406d-406a are toward a second end (e.g., the right side of FIG. 4B) of the PIC 308b. Similar to the implementation of FIG. 4A, in this implementation, the input optical power to each SOA 402a-402d is approximately 50 mW, the output power of each SOA 402a-402d is approximately 550 mW.

FIG. 4C shows an implementation of a third example PIC 308c. In this implementation, the PIC 308c comprises the plurality of power SOAs 402a-402d, a plurality of U-turns 404a-404d, a gain amplifier 408, and a splitter 410. While FIG. 4C shows four power SOAs 402a-402d, four U-turns 404a-404d, it should be understood that any number of power SOAs and U-turns may be monolithically integrated into the PIC 308c, and four power SOAs is merely used by way of example. Similarly, while only a single gain amplifier 408 and a single splitter 410 are shown in FIG. 4C, various combinations of gain amplifiers 408 and splitters 410 may be monolithically integrated into the PIC 308c in other implementations. As illustrated, an input signal is input to the gain amplifier 408. In some implementations, the gain amplifier 408 is a SOA that provides gain of approximately 10 dB, and the input to the SOA is 50 mW. In some implementations, there may be multiple gain amplifiers 408. The output of the gain amplifier 408 is input to the splitter 410. In this example, the splitter 410 is a one-to-four splitter. It should be understood that the splitter 410 or plurality of splitters have a number of outputs corresponding to the number of power SOAs 402a-402d that are integrated into the PIC 308c. For example, the splitter 410 could be a 1-to-2, 1-to-4, 1-to-8, 1-to-16, etc., in various configurations with the number of outputs from the one or more splitters matching the number of inputs to power amplifiers 402. In some implementations, the gain amplifier 408 outputs a signal with approximately 27 dBm. This signal is divided by splitter 410 into four signals that have approximately 19 dBm. Each of the signals is input to a respective power SOAs 402a-402d via a corresponding U-turn 404a-404d. The loss over the splitter 410 and the U-turns 404a-404d may be approximately 8 dB. Each power SOAs 402a-402d amplifies the signal it receives, and outputs a 550 mW signal. For example, each power SOAs 402a-402d may provide approximately 8 dB of gain. This results with the PIC 308c being able to output four amplified signals approximately 550 mW (+27 dB) each. This implementation shown in FIG. 4C, is particularly advantageous because the PIC 308c provides both a particularly high gain and/or a particularly high-power amplification. For example, typical optical gain or amplification may be the range of +2 to +25 dB. As can be seen from the plan view of FIG. 4C, each of the power SOAs 402a-402d is slightly angled as opposed to the perpendicular configuration of FIGS. 4A and 4B. In some implementations, the power SOAs 402a-402d and gain amplifier 408 have a large active waveguide spacing (along facet) of 500 μm to reduce thermal crosstalk between SOA's. It should be understood that while the SOAs 402a-402d are depicted as SOAs without any taper, but in alternate implementations, one or more of the SOAs may be a tapered semiconductor optical amplifier (TSOA).

Figure 5A:
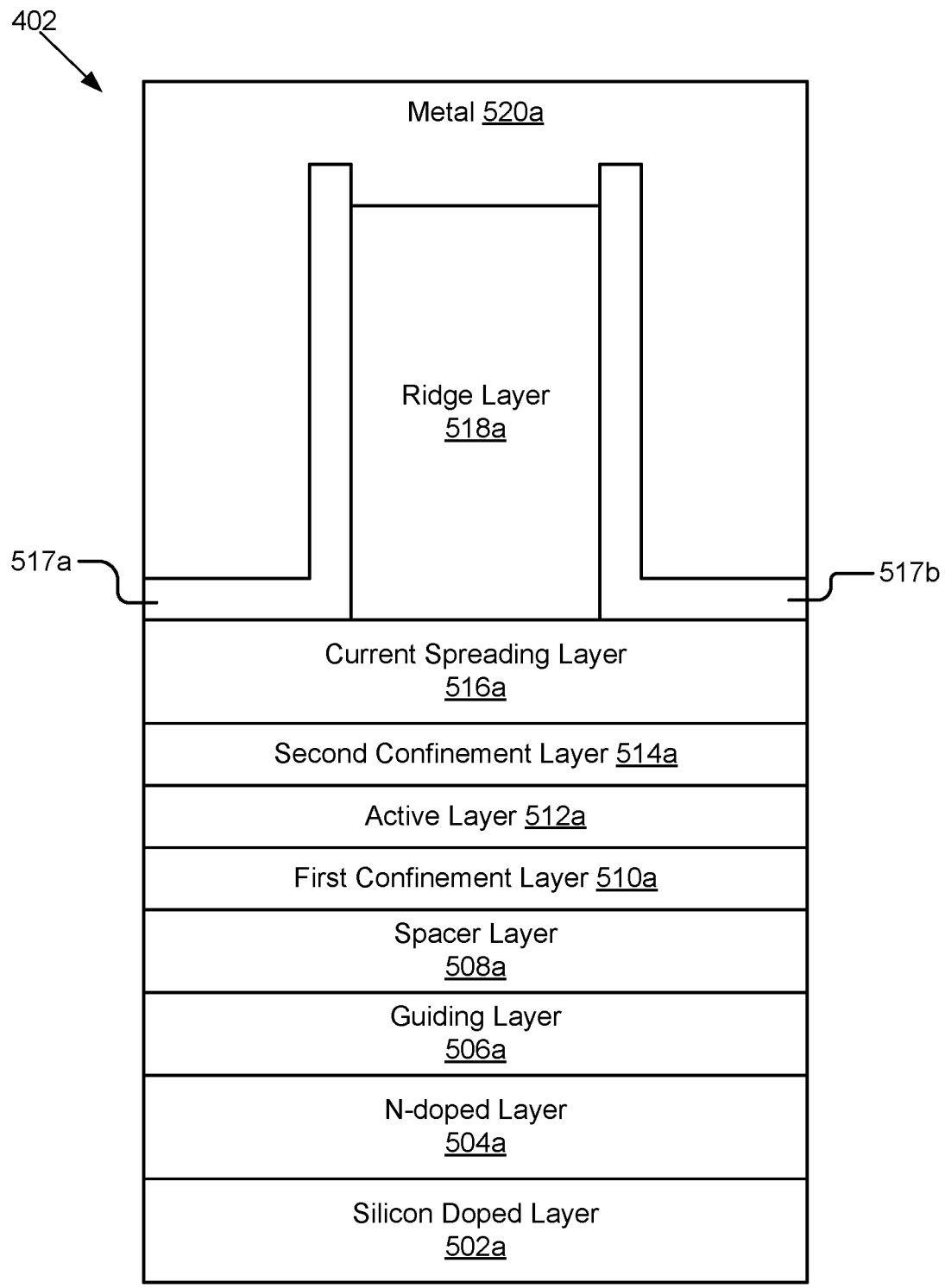
FIGS. 5A and 5B are cross sectional views of some implementations of the semiconductor optical amplifier (SOA) for a LIDAR system for autonomous vehicles.
Figure 5B:
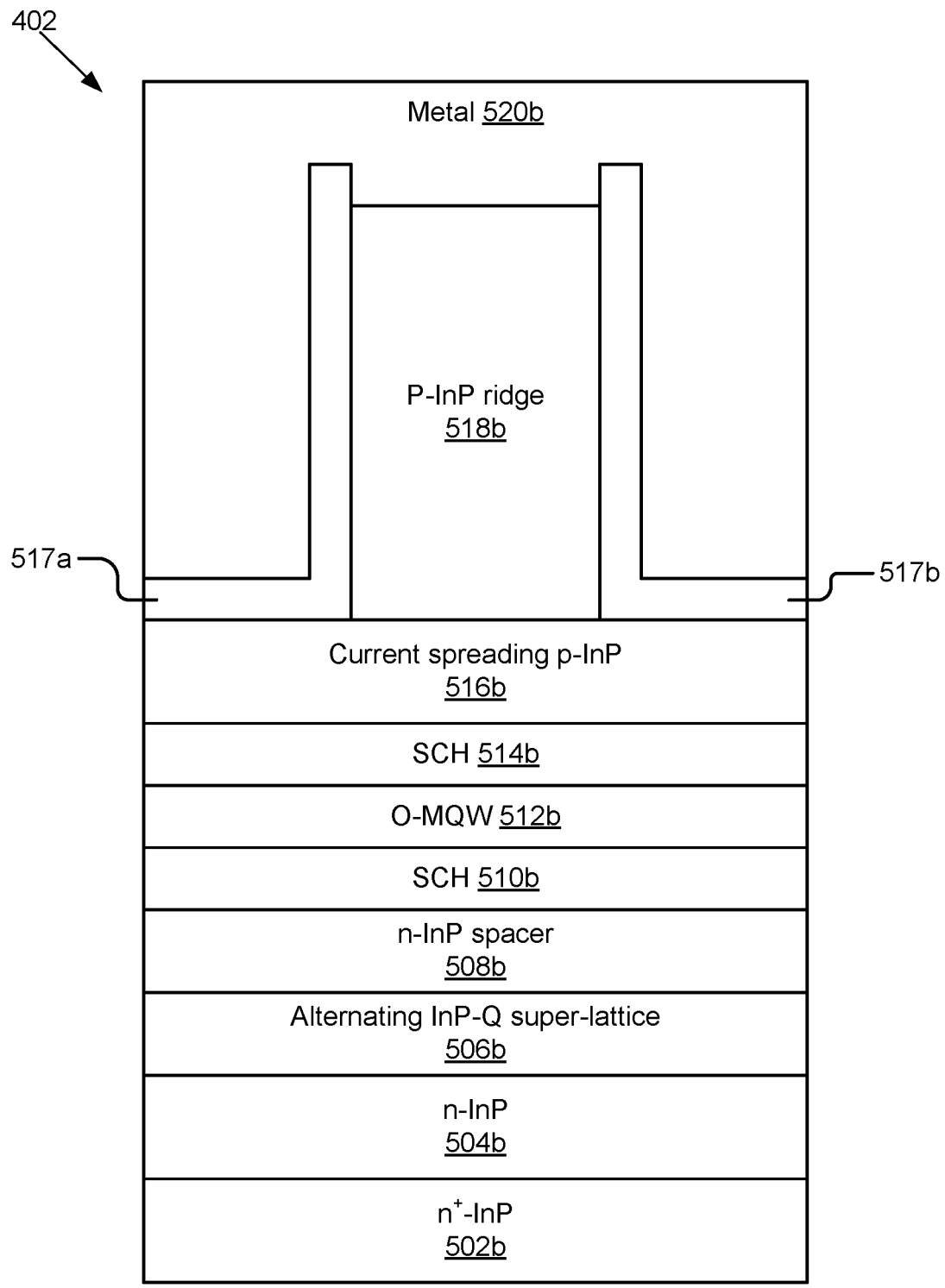
Figure 6:
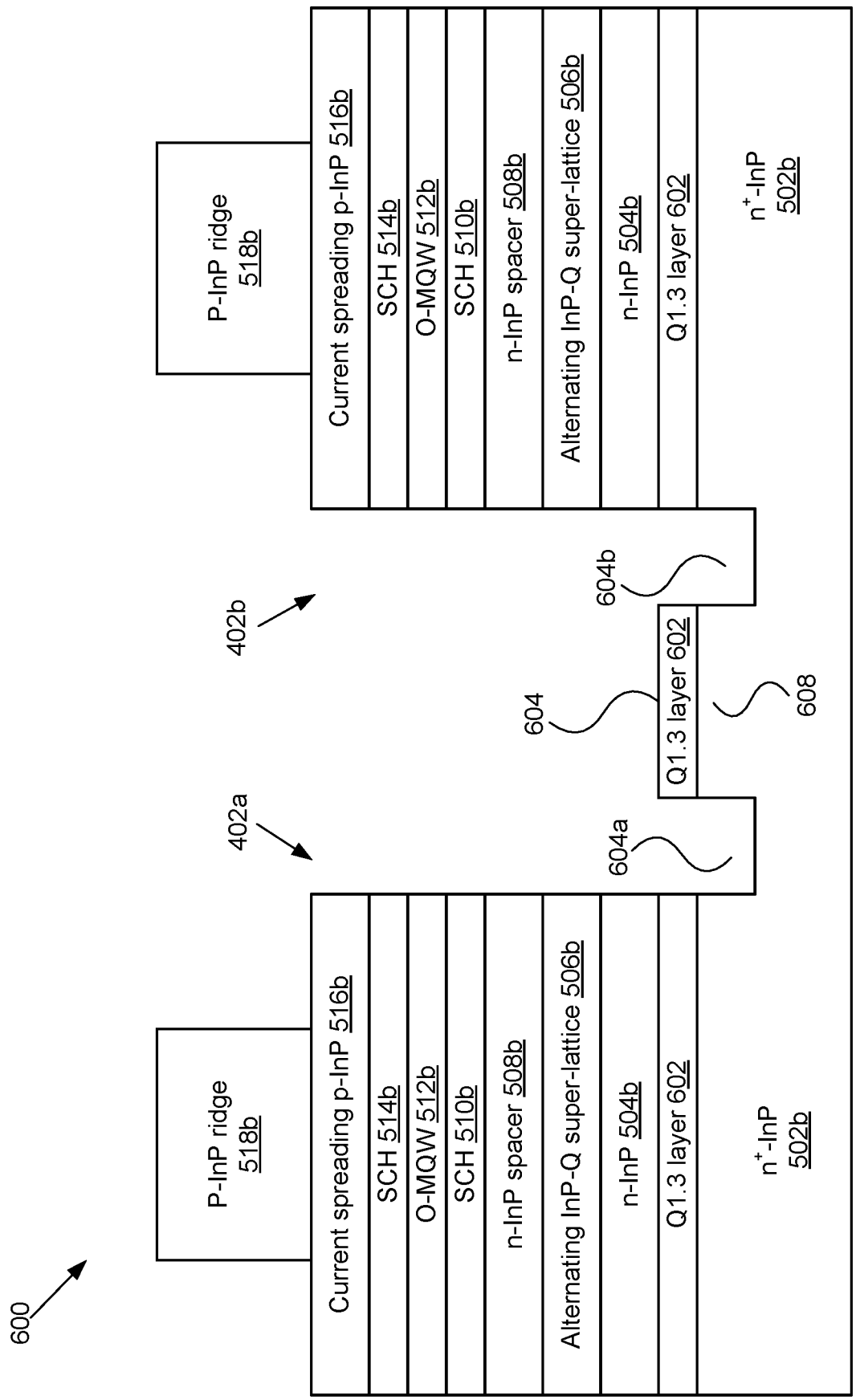
FIG. 6 is a cross sectional view of a second example implementation of the semiconductor optical amplifier (SOA) for a LIDAR system for autonomous vehicles.

FIG. 5A shows a cross sectional view of one example implementation of the SOA 402 for a LIDAR system for an autonomous vehicle. The SOA 402 comprises the following layers from bottom to top of FIG. 5A including a silicon or sulfur doped layer 502, an n-doped layer 504, a guiding layer 506, a spacer layer 508, a first confinement layer 510, an active layer 512, a second confinement layer 514 a current spreading layer 516, a ridge layer 518, and a metal layer 520. In some implementations, one or more metal layers (not shown) may be coupled to the n-doped layer 502a in the opposite direction from the n-type layer 504a. For example, a metal layer is formed, then the silicon doped layer 502a is formed on the metal layer, and the N-doped layer is formed on the silicon doped layer 502a. In other implementations, a metal layer may not be formed below the silicon doped layer 502a. With reference to FIG. 5B, one or more metal layers may be coupled to the layer 502b in the opposite direction from the layer 504b. For example, a metal layer is formed, the n+-InP layer 502b is formed on the metal layer, and the n-doped indium phosphide layer 504b is formed on the layer 502b. In other implementations, a metal layer may not be formed below the layer 502b. It should be noted that the configuration described above for FIG. 5A and below for FIGS. 5B and 6, are particularly advantageous because the backside (bottom of the chip) metallization may be applied even if the current does not flow to the bottom. The backside metallization is also used for assisting with soldering (also called die-attach) to a carrier/sub-mount and for improved thermal conductivity. In many implementations, the current can flow to the bottom of the chip, in which case the backside metallization also helps with making electrical connection to the carrier/sub-mount. Therefore, the present disclosure includes implementations with and without backside (bottom) metallization. In the case where there is no backside metallization, the current then flows to the top of the chip where there are other (additional) metal layers (not shown) to complete the circuit.

In some implementations, the silicon doped layer 502a can be an n+-InP layer, for example, silicon- or sulfur doped indium-phosphide as shown specifically in FIGS. 5B and 6. In some implementations, other types of n-doped layers may be used.

The n-doped layer 504a is formed on the silicon doped layer 502a. In some implementations, the n-doped layer 504a is a layer of n-doped indium phosphide.

The guiding layer 506a is formed on the n-doped layer 504a. In some implementations, the guiding layer 506a has a particular structure configured for thermal dissipation. In some implementations, the particular structure configured to dissipate heat includes an alternating or a periodic or a super lattice structure. For example, the guiding layer 506a may be an alternating indium phosphide (InP) and ternary or quaternary layer 506b for high wall plug efficiency for thermal dissipation. This is particularly advantageous for improving thermal dissipation. In some implementations, the guiding layer 506a may range in thickness from 300-500 nm. In some implementations, the guiding layer 506a may be Indium Gallium Arsenide Phosphide (InGaAsP) or Indium Gallium Aluminium Arsenide (InGaAlAs) or other quaternary or ternary alloys or other types of III-V semiconductor materials. The guiding layer 506a may provide a large optical mode size for integration with a silicon photonics waveguide.

The spacer layer 508a is formed on the guiding layer 506a. In some implementations, the spacer layer 508a is an n-type indium phosphide spacer. In some implementations, the spacer layer 508a may have a thickness ranging from 100-150 nm.

In some implementations, the first confinement layer 510a and the second confinement layer 514a are separate confinement heterostructures In some implementations, the first confinement layer 510a and the second confinement layer 514a may have a thickness ranging from 20 nm to ~100 nm, for example, approximately 25 nm. In some implementations, the first confinement layer 510a and the second confinement layer 514a are part of the active layer 512 slab.

The active layer 512a is formed on the first confinement layer 510a and is situated between the second confinement layer 514b. In some implementations, the active layer 512a is offset to generate a power >50 mW, for example in the range of 50 mW-800 mW. In some implementations, the active layer 512a is an offset quantum mechanical structure. More specifically, the active layer 512a may be an offset multiple quantum wells (MQW) or an offset quantum dot. For example, the active layer 512a may have 2-8 quantum wells. In some implementations, the active layer 512 may have 2-4 MQW structure with lower confinement factor of the optical mode with active MQWs in the order of a few percent, for example ~1-2%.

The current spreading layer 516a is formed on the second confinement layer 514a. In some implementations, the current spreading layer 516a is a layer of p-doped indium phosphide 516b.

The ridge layer 518a is formed on the current spreading layer 516a. In some implementations, the ridge layer 518a forms the waveguide. In some implementations, the ridge layer 518a is formed of p-doped indium phosphide 518b. For example, the metal layer 520a is formed over the top and sides of the ridge layer 518a as depicted in FIG. 5A. In this example, one or more insulation areas 517a, 517b can be formed to cover certain portions (e.g., side portions) of the ridge layer 518a and certain portions (e.g., top portion) of the current spreading layer 516a such that only a certain portion (e.g., top portion) of the ridge layer 518a is coupled to the metal layer 520a.

FIG. 5B shows an implementation of the SOA 402 for a LIDAR system for autonomous vehicles similar to that of FIG. 5A, but with example specific materials for each layer 502b-520b that have been described above provided for each layer 502a-520a as shown. For example, the ridge layer 518a is formed of p-doped indium phosphide 518b. A metal layer 520b is formed over the top and sides of the P—InP ridge layer 518b as depicted in FIG. 5B. In this example, one or more insulation areas 517a, 517b can be formed to cover certain portions (e.g., side portions) of the ridge layer 518b and certain portions (e.g., top portion) of the current spreading p-InP layer 516b such that only a certain portion (e.g., top portion) of the ridge layer 518b is coupled to the metal layer 520b.

While the SOA 402 has been described above with specific materials, it should be understood that the SOA 402 may be constructed of other materials, including but not limited to, indium phosphide (InP), gallium arsenide (GaAs), indium arsenide (InAs), gallium and nitride (GaN), or indium antimonide (InSb).

Referring now to FIG. 6, an example implementation of a PIC including an SOA array 600 including a first SOA 402a and a second SOA 402b for a LIDAR system for autonomous vehicles is described. FIG. 6 is provided to illustrate how the array of SOAs 600 may be formed using the same structure and process described above with reference to FIGS. 5A and 5B. FIG. 6 is also provided to illustrate how the SOAs 402a, 402b may have the same layers, different layers, additional layers, or fewer layers from the implementation described above with reference to FIGS. 5A and 5B. Additionally, FIG. 6 is provided to illustrate how a portion of the PIC may include alignment fiducials 604 and recess cladding for hybrid integration to further simplify the integration process. As shown in FIG. 6, a first SOA 402a is formed of layers 502b-518b and layer 602; and a second SOA 402b is formed of layers 502b-518b and layer 602. In this implementation, the first SOA 402a and the second SOA 402b share the n-doped layer, n+-InP 502b. The n+-InP layer 502b forms the bottom of both the first SOA 402a and the second SOA 402b, and defines a pair of trenches 606a and 606b, each adjacent to the first SOA 402a and the second SOA 402b, respectively. A portion of the n+-InP layer 502b between the pair of trenches 606a and 606b defines a pedestal 608. On one side of the pedestal 608 a Q1.3 layer 602 is formed. The Q1.3 layer 602 is a recess cladding layer in which alignment fiducials 604 can be etched. In some implementations, the alignment fiducial is created by using the Q1.3 layer 602 as an etch-stop layer to define a recess cladding for vertical alignment of optical modes for hybrid integration. This is particularly advantageous because these alignment fiducials provide for easy horizontal integration of the SOA array 600 with other photonics components of the LIDAR system. As noted above, the first SOA 402a and the second SOA 402b in this implementation are different in that each of the first SOA 402a and the second SOA 402b also include the Q1.3 layer 602 above the portion of the n-doped layer, n$^+$-InP 502b near their bottom or base. The Q1.3 layer 602 is positioned between the n$^+$-InP layer 502b and the n-type layer, n-InP layer 504b.

Similar to FIGS. 5A and 5B, in FIG. 6, one or more metal layers can be formed below the layer 502b. In addition, similar to FIGS. 5A and 5B, in FIG. 6, insulation areas can be formed to cover certain portions of the P-InP ridge layers 518b and certain portions of the current spreading layers 516b of the first SOA 402a and the second SOA 402b, but to expose certain portions of the P-InP layers 518b. Further, similar to the metal layers 520a, 520b in FIGS. 5A and 5B, one or more metal layers can be formed to cover the P-InP ridge layers 518b, the insulation areas, and the current spreading layers 516b such that the metal layers can be coupled only to certain portions (e.g., top portions) of the P-InP ridge layers 518b.

The foregoing detailed description of the present disclosure has been presented for purposes of illustration and description. It is not intended to be exhaustive or to limit the present disclosure to the precise form disclosed. Many modifications and variations are possible in light of the above teachings. The described implementations were chosen in order to best explain the principles of the present disclosure and its practical application, to thereby enable others skilled in the art to best utilize the present disclosure in various implementations and with various modifications as are suited to the particular use contemplated. It is intended that the scope of the present disclosure be defined by the claims appended hereto.

Although some implementations of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present disclosure is not intended to be limited to the particular implementations of the process, machine, fabrication, composition of matter, means, methods, and steps described in the specification. As one of ordinary skill in the art will readily appreciate from the description of the present disclosure, processes, machines, fabrication, compositions of matter, means, methods, or steps, presently existing or later to be developed, that perform substantially the same function or achieve substantially the same result as the corresponding implementations described herein may be utilized according to the present disclosure. Accordingly, the appended claims are intended to include within their scope such processes, machines, fabrication, compositions of matter, means, methods, or steps.

What is claimed is:

1. A light detection and ranging (LIDAR) system comprising:
    a laser configured to output a beam;
    a modulator configured to receive the beam from the laser and modulate the beam to generate a modulated beam;
    a photonic integrated circuit having an optical amplifier coupled to receive the modulated beam from the modulator and generate an amplified beam, wherein a structural configuration within the optical amplifier includes (i) an active layer, and (ii) a guiding layer coupled to the active layer and including a particular structure of alternating alloy materials that is configured to dissipate heat; and
    a transceiver chip coupled to the photonic integrated circuit, the transceiver chip configured to emit the amplified beam and receive a reflected beam from a target.

2. The LIDAR system of claim 1, wherein the active layer is an offset bulk quantum mechanical structure or a multi quantum mechanical structure.

3. The LIDAR system of claim 2, wherein the offset bulk quantum mechanical structure is one from a group of an offset multiple quantum wells or an offset quantum dot layer(s).

4. The LIDAR system of claim 1, wherein the photonic integrated circuit includes a first heat dissipation structure to reduce heat from a lower side of the photonic integrated circuit and a second heat dissipation structure to reduce heat from an upper side of the photonic integrated circuit.

5. The LIDAR system of claim 1, wherein the particular structure includes one or more alternating indium phosphide (InP) layers.

6. The LIDAR system of claim 1, wherein the particular structure includes an alternating or periodic or super lattice structure that comprises one or more alternating Indium Phosphide and Indium Gallium Arsenide Phosphide (InGaAsP) or Indium Gallium Aluminium Arsenide (InGaAlAs) or other quaternary or ternary alloy layers for improved thermal dissipation resulting in high wall plug efficiency.

7. The LIDAR system of claim 1, wherein the particular structure is integrated with a silicon photonics waveguide, the particular structure having an optical mode converter.

8. The LIDAR system of claim 1, wherein the photonic integrated circuit includes a monolithically integrated spot-size converter, wherein the photonic integrated circuit is optically coupled to an optical waveguide connector.

9. The LIDAR system of claim 1, wherein the photonic integrated circuit includes one or more passive components monolithically integrated with the optical amplifier.

10. The LIDAR system of claim 9, wherein the one or more passive components include a semiconductor optical amplifier (SOA) coupled by a U-turn to a coupler monolithically integrated to provide an input on a same side of the photonic integrated circuit.

11. The LIDAR system of claim 1, wherein the particular structure includes an alternating or a periodic or a super lattice structure.

12. The LIDAR system of claim 1, wherein the photonic integrated circuit comprises and integrates monolithically a second amplifier providing a particular gain, and an output of the second amplifier is coupled to an input of the optical amplifier.

13. A photonic integrated circuit comprising:
    a first amplifier coupled to receive an input beam and generate an amplified beam, a structural configuration within the first amplifier including an active layer and a guiding layer coupled to the active layer, the guiding layer including a particular structure of alternating alloy materials that is configured for improved thermal dissipation; and
    one or more passive components monolithically integrated with the first amplifier as part of the photonic integrated circuit.

14. The photonic integrated circuit of claim 13, wherein the active layer is an offset bulk or multi-quantum well structure.

15. The photonic integrated circuit of claim 14, wherein the offset bulk or multi quantum well structure is one from a group of an offset bulk quantum well, multiple quantum wells or an offset quantum dot layer.

16. The photonic integrated circuit of claim 13, wherein the particular structure includes an alternating or periodic or super lattice structure that comprises an alternating indium phosphide (InP) and an alloyed layer for high wall plug efficiency through improved thermal dissipation.

17. The photonic integrated circuit of claim 13, wherein the particular structure includes an alternating or periodic or super lattice structure that comprises an alternating gallium arsenide (GaAs) and an alloyed layer with high wall plug efficiency and improved thermal dissipation.

18. The photonic integrated circuit of claim 13, wherein the particular structure has an optical mode converter for integration with a silicon photonics waveguide.

19. The photonic integrated circuit of claim 13 comprising a monolithically integrated spot-size converter, wherein the photonic integrated circuit is optically coupled to an optical waveguide.

20. The photonic integrated circuit of claim 13, wherein the one or more passive components includes a semiconductor optical amplifier (SOA) coupled by a U-turn to a coupler.

21. The photonic integrated circuit of claim 13 further comprising a second amplifier providing a particular gain, an output of the second amplifier coupled to an input of the first amplifier.

\* \* \* \* \*